United States Patent
Prahlad et al.

(10) Patent No.: US 9,130,485 B2
(45) Date of Patent: Sep. 8, 2015

(54) CONFORMABLE ELECTROADHESIVE GRIPPING SYSTEM

(71) Applicant: SRI International, Menlo Park, CA (US)

(72) Inventors: Harsha Prahlad, Cupertino, CA (US); Ronald E. Pelrine, Longmont, CO (US); Roy D. Kornbluh, Palo Alto, CA (US); Roger H. Schmidt, Pacifica, CA (US); Patrick Allen Bournes, Santa Clara, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 14/052,475

(22) Filed: Oct. 11, 2013

(65) Prior Publication Data
US 2014/0104744 A1    Apr. 17, 2014

Related U.S. Application Data

(60) Provisional application No. 61/713,160, filed on Oct. 12, 2012.

(51) Int. Cl.
| | |
|---|---|
| H01T 23/00 | (2006.01) |
| H02N 13/00 | (2006.01) |
| B25J 15/00 | (2006.01) |
| H01L 21/683 | (2006.01) |

(52) U.S. Cl.
CPC .............. *H02N 13/00* (2013.01); *B25J 15/0085* (2013.01); *H01L 21/6831* (2013.01); *H01L 21/6833* (2013.01)

(58) Field of Classification Search
USPC ................................................ 361/230, 234
See application file for complete search history.

(56) References Cited

U.S. PATENT DOCUMENTS

| | | | |
|---|---|---|---|
| 6,676,761 B2 * | 1/2004 | Shang et al. ................... | 118/728 |
| 2008/0089002 A1 | 4/2008 | Pelrine et al. | |
| 2010/0032096 A1 * | 2/2010 | Yu et al. .................... | 156/345.52 |
| 2011/0111601 A1 * | 5/2011 | Okita et al. .................... | 438/716 |
| 2011/0193362 A1 | 8/2011 | Prahlad et al. | |

FOREIGN PATENT DOCUMENTS

DE    102007020898 A1    10/2007

OTHER PUBLICATIONS

PCT International Search Report and Written Opinion PCT International Application No. PCT/US2013/064589 dated Mar. 6, 2014.
Peters, Benjamin J. "Design and Fabrication of a Digitally Reconfigurable Surface", Submitted to the Department of Mechanical Engineering in Partial Fulfillment of the Requirements for the Degree of Bachelor of Science in Mechanical Engineering, Massachusetts Institute of Technology, Jun. 2011, 36 pages.

* cited by examiner

*Primary Examiner* — Danny Nguyen
(74) *Attorney, Agent, or Firm* — McDonnell Boehnen Hulbert & Berghoff LLP

(57) ABSTRACT

An electroadhesive surface can include electrodes that are configured to induce an electrostatic attraction with nearby objects upon application of voltage to the electrodes. Systems described herein may also employ a load-bearing frame that is coupled to an electroadhesive gripping surface via an array of height-adjustable pins. Adjusting the pins changes the shape of the gripping surface, and may be used to conform to objects pressed against the gripping surface. Objects pressed against the gripping surface may cause one or more of the pins to retract by sliding within respective channels so as to cause the gripping surface to conform to the object. Some examples further include pin-locking mechanisms configured to secure the position of the pins within their respective channels and thereby fix the shape of the gripping surface after conforming to the object.

20 Claims, 14 Drawing Sheets

CONFORMABLE ELECTROADHESIVE GRIPPING SYSTEM

CROSS-REFERENCE TO RELATED APPLICATIONS

This application claims priority to U.S. Provisional Patent Application No. 61/713,160, filed Oct. 12, 2012, which is incorporated herein by reference in its entirety and for all purposes.

BACKGROUND

Unless otherwise indicated herein, the materials described in this section are not prior art to the claims in this application and are not admitted to be prior art by inclusion in this section.

The mass production of products has led to many innovations over the years. Substantial developments have been made in the industrial handling of various materials and items, particularly in the area of robotics. For example, various types of robotics and other automated systems are now used in order to "pick and place" items during many manufacturing and other materials handling processes. Such robotics and other systems can include robot arms that, for example, grip, lift and/or place an item as part of a designated process. Of course, other manipulations and materials handling techniques can also be accomplished by way of such robotics or other automated systems. Despite many advances over the years in this field, there are limitations as to what can be handled in such a manner.

Conventional robotic grippers typically use either suction or a combination of large normal forces and fine control with mechanical actuation in order to grip objects. Such techniques have several drawbacks. For example, the use of suction tends to require smooth, clean, dry and generally flat surfaces, which limits the types and conditions of objects that can be gripped. Suction also tends to require a lot of power for the pumps and is prone to leaks at any location on a vacuum or low pressure seal, with a resulting loss of suction being potentially catastrophic. The use of mechanical actuation often requires large normal or "crushing" forces against an object, and also tends to limit the ability to robotically grip fragile or delicate objects. Producing large forces also increases the cost of mechanical actuation. Mechanical pumps and conventional mechanical actuation with large crushing forces also often require substantial weight, which is a major disadvantage for some applications, such as the end of a robot arm where added mass must be supported. Furthermore, even when used with sturdy objects, robotic arms, mechanical claws and the like can still leave damaging marks on the surface of the object itself.

Alternative techniques for handling items and materials also have drawbacks. For example, chemical adhesives can leave residues and tend to attract dust and other debris that reduce effectiveness. Chemical adhesives can also require a significant amount of added force to undo or overcome a grip or attachment to an object once such a chemical adhesive grip or attachment is applied, since the gripping interaction and force is typically not reversible in such instances.

Although many systems and techniques for handling materials in an automated fashion have generally worked well in the past, there is always a desired to provide alternative and improved ways of handling items. In particular, what is desirable are new automated systems and techniques that permit the picking and placing or other handling of objects that are large, irregular shaped, dusty and/or fragile, and preferably with little to no use of suction, chemical adhesives or significant mechanical normal forces against the objects.

SUMMARY

Some examples relate to electroadhesive surfaces and devices. Such an electroadhesive surface can include electrodes that are configured to induce an electrostatic attraction with nearby objects when an appropriate voltage or current is applied to the electrodes. In some cases the electrode polarization can induce a corresponding polarization in a nearby object to effect adhesion of the object to the electroadhesive surface. Systems for operating such an electroadhesive surface can include an electroadhesive gripper, one or more power supplies and a controller. The power supply can be configured to apply voltage or current to the one or more electrodes in the electroadhesive gripper to polarize electrodes in an electroadhesive gripping surface of the gripper. Systems described herein may also employ a load-bearing frame that is coupled to the electroadhesive surface via an array of height-adjustable pins to allow the electroadhesive gripping surface to conform to objects pressed against the gripping surface. Objects pressed against the gripping surface may cause one or more of the pins to retract by sliding within respective channels so as to cause the gripping surface to conform to the object. Some examples further include pin-locking mechanisms configured to secure the position of the pins within their respective channels and thereby fix the shape of the gripping surface with the item-specific conformance.

Some embodiments of the present disclosure provide a system. The system can include an electroadhesive surface, a load-bearing frame, and a power supply. The electroadhesive surface can be associated with one or more electrodes. The load-bearing frame can include a plurality of pins passing through a plurality of corresponding channels. The plurality of pins can be coupled to the electroadhesive surface so as to couple the load-bearing frame to the electroadhesive surface. The pins can be configured to slide within their corresponding channels to thereby adjust a shape of the electroadhesive surface. The power supply can be configured to apply a voltage to the one or more electrodes associated with the electroadhesive surface to thereby cause the electroadhesive surface to adhere to an item situated proximate to the electroadhesive surface.

Some embodiments of the present disclosure provide a method. The method can include placing an electroadhesive surface in contact with an exterior surface of an item. The electroadhesive surface can be coupled to a load-bearing frame via a plurality of pins configured to be received within a plurality of corresponding channels formed in the load-bearing frame. The pins can be configured to slide within their corresponding channels to thereby adjust a shape of the electroadhesive surface. The method can include moving the load-bearing frame toward the exterior surface of the item such that one or more of the pins slide within their corresponding channels and thereby conform the electroadhesive surface to the exterior surface of the item. The method can include applying voltage to one or more electrodes associated with the electroadhesive surface to thereby cause the electroadhesive surface to adhere to the item. The method can include reducing the voltage applied to the one or more electrodes such that the item is released from the electroadhesive surface.

These as well as other aspects, advantages, and alternatives, will become apparent to those of ordinary skill in the art by reading the following detailed description, with reference where appropriate to the accompanying drawings.

DETAILED DESCRIPTION

Figure 1A:
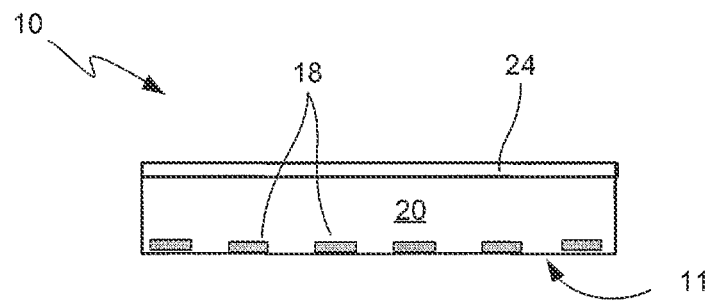
FIG. 1A is a side cross-section of an example electroadhesive device.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

An electroadhesive surface can include electrodes that are configured to induce an electrostatic attraction with nearby objects upon application of voltage to the electrodes. Systems described herein may also employ a load-bearing frame that is coupled to an electroadhesive gripping surface via an array of height-adjustable pins. The pins may slide within channels formed in the frame. Adjusting the pins changes the shape of the gripping surface, and allows the gripping surface to conform to objects pressed against the gripping surface. For example, an objects pressed against the gripping surface may cause one or more of the pins to retract by sliding within respective channels so as to cause the gripping surface to conform to the object.

Some embodiments of the present disclosure find application in item handling. For example, complex-shaped objects, articles of clothing, or other items may be manipulated by a gripper with an electroadhesive surface coupled to an array of height-adjustable pins to allow the electroadhesive surface to conform to such items. The pins can slide within channels of a load-bearing frame, and the frame can be positioned manually or via a robotic control arm, gantry, etc., to manipulate the item as desired. Moving the electroadhesive surface against an item to be handled causes the heights of the pins in the array to slide until the electroadhesive surface conforms to the item.

A pin-locking mechanism can enable the pins to be selectively locked in position within their channels to fix the shape of the electroadhesive surface. In some examples, because the pin array is adjusted passively based on pressure from an object pushing against the pin array, the gripping surface can conform to complex shaped objects even without having any prior knowledge of the object's shape or its position. The pin-locking mechanism can then cause the object-specific shape of the gripping surface to be fixed during manipulation of the object. Such conformance can enhance the strength of the adhesion to the item due to the increased surface area between the electroadhesive surface and the object being handled, enabling more secure, predictable maneuvers, and more rapid movements. Automated handling operations can therefore be made safer and/or faster by use of such conformable gripping systems.

II. Example Electroadhesive Systems

As the term is used herein, 'electroadhesion' refers to the mechanical coupling of two objects using electrostatic forces. Electroadhesion as described herein uses electrical control of these electrostatic forces to permit temporary and detachable attachment between two objects. This electrostatic adhesion holds two surfaces of these objects together or increases the effective traction or friction between two surfaces due to electrostatic forces created by an applied electric field. In addition to holding two flat, smooth and generally conductive surfaces together, disclosed herein are electroadhesion devices and techniques that do not limit the material properties or surface roughness of the objects subject to electroadhesive forces and handling. In some cases, an electroadhesive surface may be a compliant surface to facilitate electroadhesive attraction independent of surface roughness. For example, the electroadhesive surface may have sufficient flexibility for the surface to follow local non-uniformities and/or imperfections of an exterior surface of an adhered object. For example, the electroadhesive surface can at least partially conform to microscopic, mesoscopic, and/or macroscopic surface features. When an appropriate voltage is applied to such a compliant electroadhesive surface, the electroadhesive surface is attracted to the exterior surface of the adhered object, and the attraction causes the electroadhesive surface to at least partially conform to the exterior surface by flexing locally such that the electroadhesive surface moves toward the exterior surface.

The present disclosure relates in various embodiments to systems, devices and methods involving electroadhesive or electrostatic applications. In some embodiments, various electroadhesive or electrostatic systems or devices can include electrodes adapted to deliver an electrostatic force suitable to adhere separate objects together. Additionally, a secondary adhesion component, such as a base surface, may be included that facilitates the use of a secondary force or manner in addition to the electrostatic force to adhere the separate objects together. In some instances, such a base surface or other secondary adhesion component can include a soft pad material having multiple modes of adhesion to a foreign object. While the various examples disclosed herein focus on particular aspects of specific electroadhesive applications, it will be understood that the various principles and embodiments disclosed herein can be applied to other electrostatic applications and arrangements as well. In addition, while the various examples and discussions set forth herein often refer to a "secondary" force or component in addition to an electroadhesive force or components, it will be readily appreciated that such other forces or components need not be considered "secondary" in all instances. In some examples, it may be more appropriate to consider one type of forces or items as electrostatic or electroadhesive attraction forces or components, and another type of forces or items as separate attraction forces or components that are separate from the electrostatic or electroadhesive types. Such other attraction forces may be physical in nature, and as such can be referred to as physical attraction forces that can be used to augment the electrostatic or electroadhesion forces.

Turning first to FIG. 1A, an example electroadhesive device is illustrated in elevated cross-sectional view. Electroadhesive device 10 includes one or more electrodes 18 located at or near an "electroadhesive gripping surface" 11 thereof, as well as an insulating material 20 between electrodes and a backing 24 or other supporting structural component. For purposes of illustration, electroadhesive device 10 is shown as having six electrodes in three pairs, although it will be readily appreciated that more or fewer electrodes can be used in a given electroadhesive device. Where only a single electrode is used in a given electroadhesive device, a complimentary electroadhesive device having at least one electrode of the opposite polarity is preferably used therewith. With respect to size, electroadhesive device 10 is substantially scale invariant. That is, electroadhesive device sizes may range from less than 1 square centimeter to greater than several meters in surface area. Even larger and smaller surface areas are also possible, and may be sized to the needs of a given application.

Figure 1B:
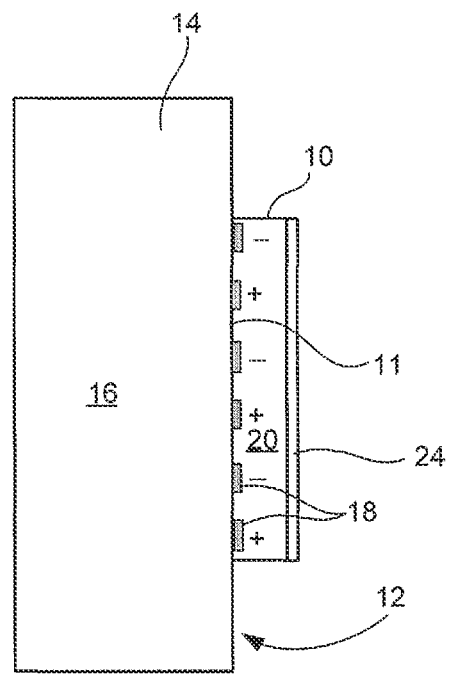
FIG. 1B illustrates in side cross-sectional view the example electroadhesive device of FIG. 1A adhered to a foreign object.

FIG. 1B depicts in elevated cross-sectional view of the example electroadhesive device 10 of FIG. 1A adhered to a foreign object 14. Foreign object 14 includes surface 12 and inner material 16. Electroadhesive gripping surface 11 of electroadhesive device 10 is placed against or nearby surface 12 of foreign object 14. An electrostatic adhesion voltage is then applied via electrodes 18 using external control electronics (not shown) in electrical communication with the electrodes 18. As shown in FIG. 1B, the electrostatic adhesion voltage uses alternating positive and negative charges on neighboring electrodes 18. As a result of the voltage difference between electrodes 18, one or more electroadhesive forces are generated, which electroadhesive forces act to hold the electroadhesive device 10 and foreign object 14 to each other. Due to the nature of the forces being applied, it will be readily appreciated that actual contact between electroadhesive device 10 and foreign object 14 is not necessary. Rather sufficient proximity to allow the electric field based electroadhesive interaction to take place is all that is necessary. For example, a piece of paper, thin film, or other material or substrate may be placed between electroadhesive device 10 and foreign object 14. Furthermore, although the term "contact" is used herein to denote the interaction between an electroadhesive device and a foreign object, it will be understood that actual direct surface to surface contact is not always required, such that one or more thin objects such as an insulator, can be disposed between an device or electroadhesive gripping surface and the foreign object. In some embodiments such an insulator between the gripping surface and foreign object can be a part of the device, while in others it can be a separate item or device.

Additionally or alternatively, there may be a gap between the electroadhesive gripping surface and the object being gripped and this gap can be decreased upon activation of the electroadhesive force. For example, the electroadhesive force can cause the electroadhesive gripping surface to move closer to the exterior surface of the object being gripped so as to close the gap. Moreover, the electroadhesive attraction can cause the gripping surface to move toward the exterior surface of the object being gripped at multiple points across the surface area of the gripping surface. For example, the compliant gripping surface to conform to the exterior surface microscopically, mesoscopically, and/or macroscopically. Such local gap-closing by the gripping surface can thereby cause the gripping surface to (at least partially) conform to the exterior surface of the object. Electroadhesive gripping surfaces with sufficient flexibility to conform to local non-uniformities, surface imperfections and other micro-variations and/or macro-variations in exterior surfaces of objects are referred to herein as compliant gripping surfaces. However, it is understood that any of the gripping surfaces described herein may exhibit such compliance whether specifically referred to as compliant gripping surfaces or not.

Figure 1C:
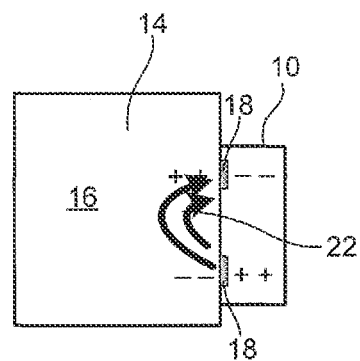
FIG. 1C illustrates in side cross-sectional close-up view an electric field formed in the foreign object of FIG. 1B as result of the voltage difference between electrodes in the adhered example electroadhesive device.

FIG. 1C illustrates in elevated cross-sectional close-up view an electric field formed in the foreign object of FIG. 1B as a result of the voltage difference between electrodes in the adhered example electroadhesive device 10. While the electroadhesive device 10 is placed against foreign object 14 and an electrostatic adhesion voltage is applied, an electric field 22 forms in the inner material 16 of the foreign object 14. The electric field 22 locally polarizes inner material 16 or induces direct charges on material 16 locally opposite to the charge on the electrodes of the device 18 and thus causes electrostatic adhesion between the electrodes 18 (and device 10) and the induced charges on the foreign object 16. The induced charges may be the result of a dielectric polarization or from weakly conductive materials and electrostatic induction of charge. In the event that the inner material 16 is a strong conductor, such as copper for example, the induced charges may completely cancel the electric field 22. In this case the internal electric field 22 is zero, but the induced charges nonetheless still form and provide electrostatic force to the electroadhesive device.

Thus, the electrostatic adhesion voltage provides an overall electrostatic force, between the electroadhesive device 10 and inner material 16 beneath surface 12 of foreign object 14, which electrostatic force maintains the current position of the electroadhesive device relative to the surface of the foreign object. The overall electrostatic force may be sufficient to overcome the gravitational pull on the foreign object 14, such that the electroadhesive device 10 may be used to hold the foreign object aloft. In various embodiments, a plurality of electroadhesive devices may be placed against foreign object 14, such that additional electrostatic forces against the object can be provided. The combination of electrostatic forces may be sufficient to lift, move, pick and place, or otherwise handle the foreign object. Electroadhesive device 10 may also be attached to other structures and hold these additional structures aloft, or it may be used on sloped or slippery surfaces to increase normal friction forces.

Removal of the electrostatic adhesion voltages from electrodes 18 ceases the electrostatic adhesion force between electroadhesive device 10 and the surface 12 of foreign object 14. Thus, when there is no electrostatic adhesion voltage between electrodes 18, electroadhesive device 10 can move more readily relative to surface 12. This condition allows the electroadhesive device 10 to move before and after an electrostatic adhesion voltage is applied. Well controlled electrical activation and de-activation enables fast adhesion and detachment, such as response times less than about 50 milliseconds, for example, while consuming relatively small amounts of power.

Electroadhesive device 10 includes electrodes 18 on an outside surface 11 of an insulating material 20. This embodiment is well suited for controlled attachment to insulating and weakly conductive inner materials 14 of various foreign objects 16. Other electroadhesive device 10 relationships between electrodes 18 and insulating materials 20 are also contemplated and suitable for use with a broader range of materials, including conductive materials. For example, a thin electrically insulating material (not shown) can be located on the surfaces of the electrodes. As will be readily appreciated, a shorter distance between surfaces 11 and 12 as well as the material properties of such an electrically insulating material results in a stronger electroadhesive attraction between the objects due to the distance dependence of the field-based induced electroadhesive forces. Accordingly, a deformable surface 11 adapted to at least partially conform to the surface 12 of the foreign object 14 can be used.

As the term is used herein, an electrostatic adhesion voltage refers to a voltage that produces a suitable electrostatic force to couple electroadhesive device 10 to a foreign object 14. The minimum voltage needed for electroadhesive device 10 will vary with a number of factors, such as: the size of electroadhesive device 10, the material conductivity and spacing of electrodes 18, the insulating material 20, the foreign object material 16, the presence of any disturbances to electroadhesion such as dust, other particulates or moisture, the weight of any objects being supported by the electroadhesive force, compliance of the electroadhesive device, the dielectric and resistivity properties of the foreign object, and/or the relevant gaps between electrodes and foreign object surface. In one embodiment, the electrostatic adhesion voltage includes a differential voltage between the electrodes 18 that is between about 500 volts and about 15 kilovolts. Even lower voltages may be used in micro applications. In one embodiment, the differential voltage is between about 2 kilovolts and about 5 kilovolts. Voltage for one electrode can be zero. Alternating positive and negative charges may also be applied to adjacent electrodes 18. The voltage on a single electrode may be varied in time, and in particular may be alternated between positive and negative charge so as to not develop substantial long-term charging of the foreign object. The resultant clamping forces will vary with the specifics of a particular electroadhesive device 10, the material it adheres to, any particulate disturbances, surface roughness, and so forth. In general, electroadhesion as described herein provides a wide range of clamping pressures, generally defined as the attractive force applied by the electroadhesive device divided by the area thereof in contact with the foreign object.

The actual electroadhesion forces and pressure will vary with design and a number of factors. In one embodiment, electroadhesive device 10 provides electroadhesive attraction pressures between about 0.7 kPa (about 0.1 psi) and about 70 kPa (about 10 psi), although other amounts and ranges are certainly possible. The amount of force needed for a particular application may be readily achieved by varying the area of the contacting surfaces, varying the applied voltage, and/or varying the distance between the electrodes and foreign object surface, although other relevant factors may also be manipulated as desired.

Because an electrostatic adhesion force is the primary force used to hold, move or otherwise manipulate a foreign object, rather than a traditional mechanical or "crushing" force, the electroadhesive device 10 can be used in a broader set of applications. For example, electroadhesive device 10 is well suited for use with rough surfaces, or surfaces with macroscopic curvature or complex shape. In one embodiment, surface 12 includes roughness greater than about 100 microns. In a specific embodiment, surface 12 includes roughness greater than about 3 millimeters. In addition, electroadhesive device 10 can he used on objects that are dusty or dirty, as well as objects that are fragile. Objects of varying sizes and shapes can also be handled by one or more electroadhesive devices, as set forth in greater detail below.

2b) Electroadhesive Gripping Surfaces

Although electroadhesive device 10 having electroadhesive gripping surface 11 of FIG. 1A is shown as having six electrodes 18, it will be understood that a given electroadhesive device or gripping surface can have just a single electrode. Furthermore, it will be readily appreciated that a given electroadhesive device can have a plurality of different electroadhesive gripping surfaces, with each separate electroadhesive gripping surface having at least one electrode and being adapted to be placed against or in close proximity to the foreign object to be gripped. Although the terms electroadhesive device, electroadhesive gripping unit and electroadhesive gripping surface are all used herein to designate electroadhesive components of interest, it will be understood that these various terms can be used interchangeably in various contexts. In particular, while a given electroadhesive device might comprise numerous distinct gripping surfaces, these different gripping surfaces might also be considered separate "devices" or alternatively "end effectors" themselves. Embodiments with multiple different gripping surfaces may be considered as one single device or may also be considered as numerous different devices acting in concert.

Figure 2A:
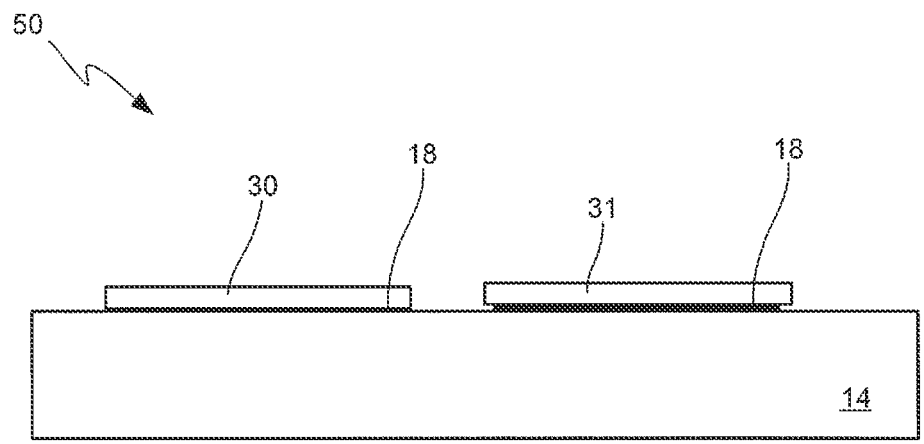
FIG. 2A illustrates in side cross-sectional view an example pair of electroadhesive gripping surfaces having single electrodes thereon.
Figure 2B:
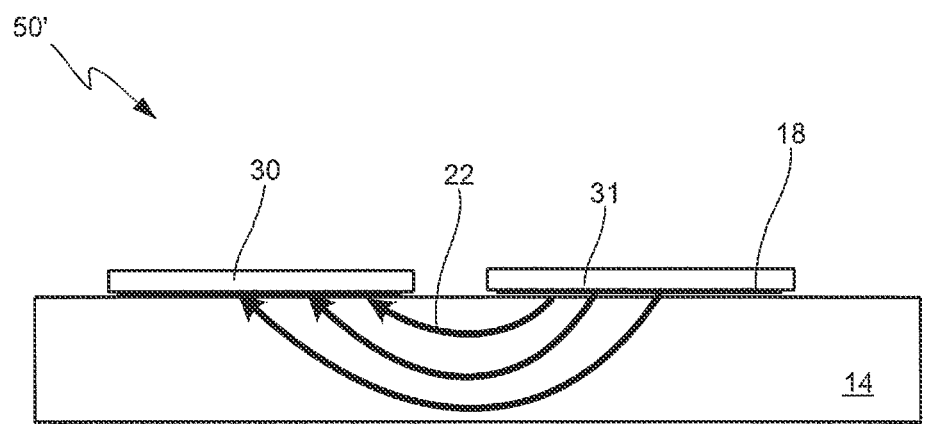
FIG. 2B illustrates in side cross-sectional view the example pair of electroadhesive gripping surfaces of FIG. 2A with voltage applied thereto.

Referring to FIGS. 2A and 2B, an example pair of electroadhesive devices or gripping surfaces having single electrodes thereon is shown in side cross-sectional view. FIG. 2A depicts electroadhesive gripping system 50 having electroadhesive devices or gripping surfaces 30, 31 that are in contact with the surface of a foreign object 16, while FIG. 2B depicts activated electroadhesive gripping system 50' with the devices or gripping surfaces having voltage applied thereto. Electroadhesive gripping system 50 includes two electroadhesive devices or gripping surfaces 30, 31 that directly contact the foreign object 16. Each electroadhesive device or gripping surface 30, 31 has a single electrode 18 coupled thereto. In such cases, the electroadhesive gripping system can be designed to use the foreign object as an insulation material. When voltage is applied, an electric field 22 forms within foreign object 14, and an electrostatic force between the gripping surfaces 30, 31 and the foreign object is created. Various embodiments that include numerous of these single electrode electroadhesive devices can be used, as will be readily appreciated.

In some embodiments, an electroadhesive gripping surface can take the form of a flat panel or sheet having a plurality of electrodes thereon. In other embodiments, the gripping surface can take a fixed shape that is matched to the geometry of the foreign object most commonly lifted or handled. For example, a curved geometry can be used to match the geometry of a cylindrical paint can or soda can. The electrodes may be enhanced by various means, such as by being patterned on an adhesive device surface to improve electroadhesive performance, or by making them using soft or flexible materials to increase compliance and thus conformance to irregular surfaces on foreign objects.

Figure 3A:
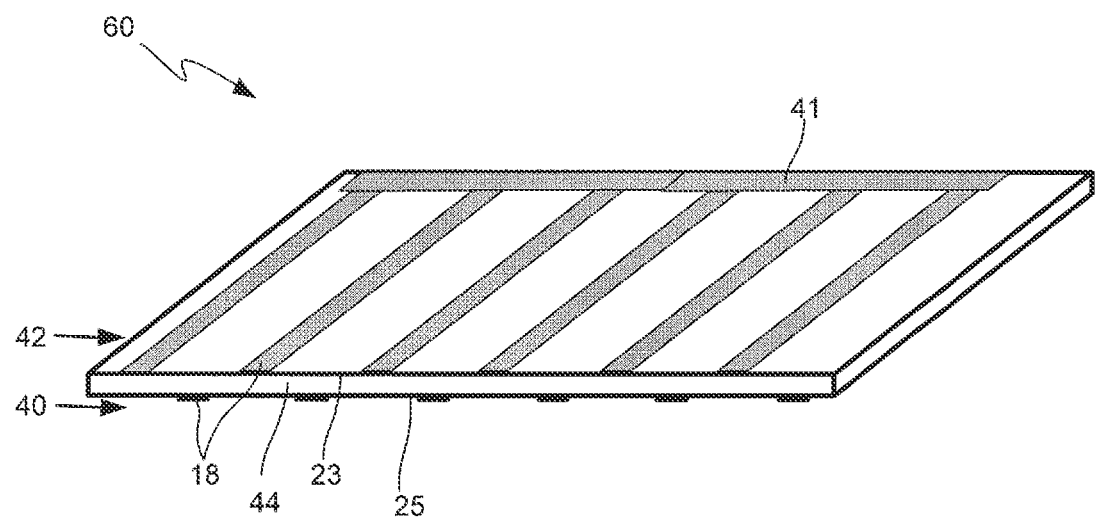
FIG. 3A illustrates in top perspective view an example electroadhesive gripping surface in the form of a sheet with electrodes patterned on top and bottom surfaces thereof.
Figure 3B:
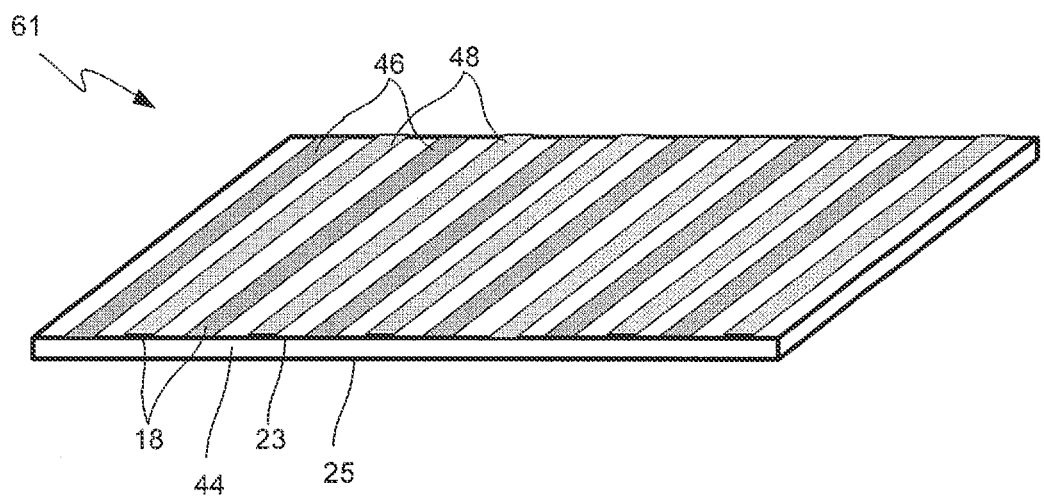
FIG. 3B illustrates in top perspective view another example electroadhesive gripping surface in the form of a sheet with electrodes patterned on a single surface thereof.

Turning next to FIGS. 3A and 3B, two examples of electroadhesive gripping surfaces in the form of flat panels or sheets with electrodes patterned on surfaces thereof are shown in top perspective view. FIG. 3A shows electroadhesive gripping surface 60 in the form of a sheet or flat panel with electrodes 18 patterned on top and bottom surfaces thereof. Top and bottom electrodes sets 40 and 42 are interdigitated on opposite sides of an insulating layer 44. In some cases, insulating layer 44 can be formed of a stiff or rigid material. In some cases, the electrodes as well as the insulating layer 44 may be compliant and composed of a polymer, such as an acrylic elastomer, to increase compliance. In one preferred embodiment the modulus of the polymer is below about 10 MPa and in another preferred embodiment it is more specifically below about 1 MPa. Various known types of compliant electrodes are suitable for use with the devices and techniques described herein, and examples are described in U.S. Pat. No. 7,034,432, which is incorporated by reference herein in its entirety and for all purposes.

Electrode set 42 is disposed on a top surface 23 of insulating layer 44, and includes an array of linear patterned electrodes 18. A common electrode 41 electrically couples electrodes 18 in set 42 and permits electrical communication with all the electrodes 18 in set 42 using a single input :lead to common electrode 41. Electrode set 40 is disposed on a bottom surface 25 of insulating layer 44, and includes a second array of linear patterned electrodes 18 that is laterally displaced from electrodes 18 on the top surface. Bottom electrode set 40 may also include a common electrode (not shown). Electrodes can be patterned on opposite sides of an insulating layer 44 to increase the ability of the gripping surface 60 to withstand higher voltage differences without being limited by breakdown in the air gap between the electrodes, as will be readily appreciated.

Alternatively, electrodes may also be patterned on the same surface of the insulating layer, such as that which is shown in FIG. 3B. As shown, electroadhesive gripping surface 61 comprises a sheet or flat panel with electrodes 18 patterned only on one surface thereof. Electroadhesive gripping surface 61 can be substantially similar to electroadhesive gripping surface 60 of FIG. 3A, except that electrodes sets 46 and 48 are interdigitated on the same surface 23 of a compliant insulating layer 44. No electrodes are located on the bottom surface 25 of insulating layer 44. This particular embodiment decreases the distance between the positive electrodes 18 in set 46 and negative electrodes 18 in set 48, and allows the placement of both sets of electrodes on the same surface of electroadhesive gripping surface 61. Functionally, this eliminates the spacing between the electrodes sets 46 and 48 due to insulating layer 44, as in embodiment 60. It also eliminates the gap between one set of electrodes (previously on bottom surface 25) and the foreign object surface when the top surface 23 adheres to the foreign object surface. In some cases, the top (electrode) surface 23 may be further coated with an insulating material (not shown) so that the electrode sets 46 and 48 are completely sandwiched (e.g., encapsulated) between insulating materials. Although either embodiment 60 or 61 can be used, these changes in the latter embodiment 61 provide relatively greater electroadhesive forces between electroadhesive gripping surface 61 and the subject foreign object to be handled due to the closer proximity of both sets of electrodes 46, 48 to the foreign object surface.

In some embodiments, an electroadhesive device or gripping surface may comprise a sheet or veil type grasper that is substantially flexible in nature. In such embodiments, either no backing structure or a substantially flexible backing structure can be used, such that all or a portion of the veil type device or gripping surface can substantially flex or otherwise conform to a foreign object or objects, as may be desired for a given application. Creating electroadhesive grippers that facilitate such conforming or compliance to a foreign object can be achieved, for example, by forming the electroadhesive layer or gripping surface out of thin materials, by using foam or elastic materials, by butting out flaps or extensions from a primary electroadhesive sheet, or by connecting the sheet only at a few selected underlying locations, rather than to an entire rigid backing, among other possibilities.

Although the foregoing example embodiments for electroadhesive gripping surfaces in the form of flat panels or sheets depict bars or stripes for electrodes, it will be understood that any suitable pattern for electrodes could also be used for such a sheet-type electroadhesive gripping surface. For example, a sheet-type electroadhesive gripping surface could have electrodes in the form of discrete squares or circles that are distributed about the sheet and polarized in an appropriate manner, such as in an evenly spaced "polka-dot" style pattern. Other examples such as two sets of electrodes patterned as offset spirals can also be used. As one particular example, where a thin and flexible material is used for the insulating layer, such as a polymer, and where electrodes are distributed thereabout in the form of discrete discs, a resulting flexible and compliant electroadhesive gripping surface "blanket" would be able to conform to the irregular surfaces of a relatively large object while providing numerous different and discrete electroadhesive forces thereto during voltage application.

III. Pin-Driven Conformable Electroadhesive Gripper

Some embodiments of the present disclosure find application in item handling. For example, complex-shaped objects, articles of clothing, or other items may be manipulated by a gripper with an electroadhesive surface coupled to an array of height-adjustable pins to allow the electroadhesive surface to conform to such items. The pins can slide within channels of a load-bearing frame, and the frame can be positioned manually or via a robotic control arm, gantry, etc., to manipulate the item as desired. Moving the electroadhesive surface against an item to be handled causes the heights of the pins in the array to slide until the electroadhesive surface conforms to the item. A pin-locking device can enable the pins to be selectively locked in position within their channels to fix the shape of the electroadhesive surface. In some examples, because the pin array is adjusted passively based on pressure from an object pushing against the pin array, the gripping surface can conform to complex shaped objects even without having any prior knowledge of the object's shape or its position.

Figure 4A:
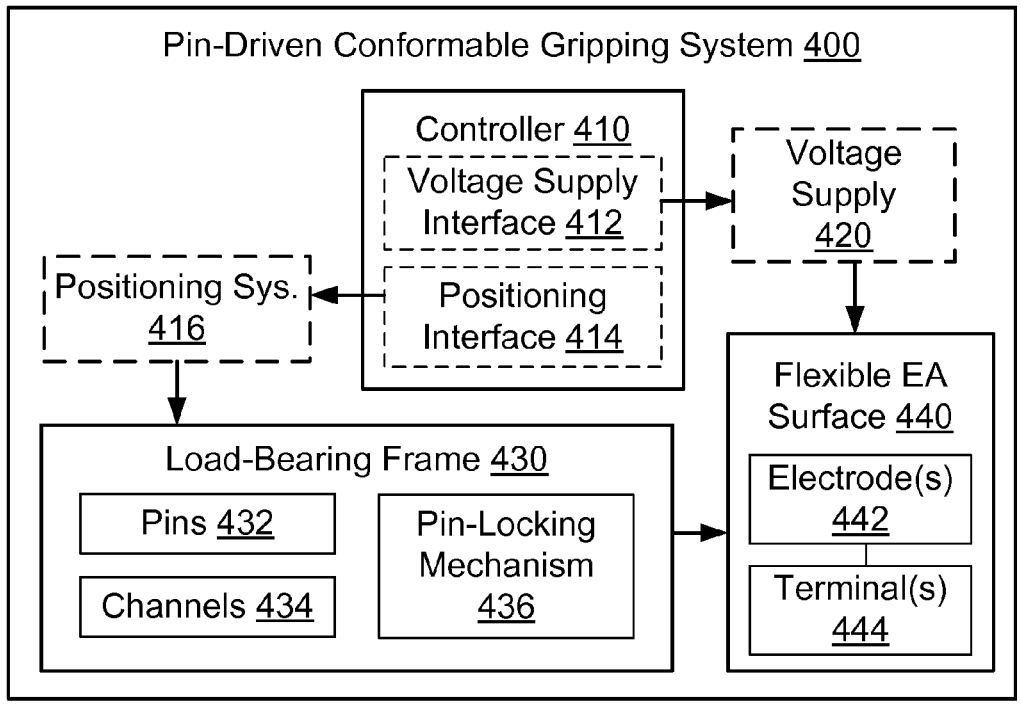
FIG. 4A is a functional block diagram of an example pin-driven conformable gripping system.

FIG. 4A is a functional block diagram of an example pin-driven conformable gripping system 400. The gripping system 400 includes a controller 410, a voltage supply 420, and at least one pin-driven conformable gripper, which can include a load-bearing frame 430 and a flexible electroadhesive (EA) gripping surface 440. The voltage supply 420 can be configured to supply high DC voltages in a range of, for example, 0.5 kilovolt ("kV") to about 10 kV, similar to the electroadhesion voltages discussed above in connection with FIGS. 1-3. The electroadhesive gripping surface 440 includes integrated electrodes 442 connected to the voltage supply 420 via respective terminals 444. The electrodes 442 can be patterned according to a variety of different geometries within the platform surface and are generally arranged such that opposing polarity electrodes are situated adjacent one another. The electrodes 442 may be arranged with opposing polarity electrodes alternating one another (e.g., interdigitated electrodes), similar to the example electrode geometries described above in connection with FIGS. 1-3.

It is noted that the voltage supply 420 may generally be a power supply configured to output AC or DC voltages or currents sufficient to apply a polarizing voltage to the electrodes 442. For convenience in the description herein, the module 420 is therefore referred to as "voltage supply," although some embodiments may employ current supplies and/or other electrical power supplies. For example, current supplies may be tuned to provide suitable currents for generate desired polarizing voltages at the electrodes.

The electroadhesive gripping surface 440 can be coupled to a load-bearing frame 430 or other support structure, which can be a rigid or semi-rigid structure used to distribute forces exerted on the electroadhesive surface 440 caused by items adhered thereto. The frame 430 can include pins 432 situated to slide within corresponding channels 434. The channels 434 may be formed in a rigid or semi-rigid plate. The channels 434 may be arranged in rows and columns such that the sliding pins 432 extend from the frame 430 in a two-dimensional array. The ends of the pins 432 extending away from the frame 430 are then coupled to electroadhesive surface 440. The pins 432 can couple to a back side of the electroadhesive surface 440, opposite the electroadhesive gripping surface thereof. The shape of the electroadhesive surface 440 is thus based on the positions of the individual pins 432 within their respective channels 434. A pin-locking mechanism 436 may be included to selectively lock the position of the pins 432 in their channels 434 and thereby fix the shape of the electroadhesive surface 440.

The pins 432 can be formed of a rigid, substantially incompressible material, such as a metal, plastic, or composite material. During conformance of the gripper 400 to an object of interest, the pins 432 push the electroadhesive surface 440 against the object. The force exerted by the pins 432 may result, in part, from the weight of the pins 432. Additional forces, such as from springs or other mechanisms including pneumatic, hydraulic, or electromagnetic pressure (e.g., from a solenoid actuator), may also be exerted through the pins 432. The shape of the object against the electroadhesive surface 440 is transferred to the pins 432, which react by sliding within their channels 434, inward to accommodate the object. Once all pins in the array reach respective positions due to force from pushing against the object, the electroadhesive surface 440 conforms to the shape of the foreign object. The force resulting from the weight of the pins 432 or additional forces from the springs or other mechanisms noted above can be used to cause rapid release of the object being held by the electroadhesive surface 440. In some cases, deactivating electroadhesion in the gripping surface 440 combined with the forceful extension of the pins 432 to their respective maximum extension points can rapidly eject an adhered object from the gripping surface 440 (i.e., the pins 432 can drive the object away from the gripping surface 440). Thus, forcefully extended pins may allow an object to be rapidly released (ejected) from a gripping surface on demand, and may allow for release to occur faster than by deactivating electroadhesion alone, and allowing an adhered object to detach (e.g., under the influence of gravity).

The frame 430 may further include (or be coupled to) a backing, one or more support members, or other structural elements to allow the frame 430 to be manipulated via a positioning system 416. Moving the load-bearing frame 430 (e.g., via the positioning system 416) results in movement of the electroadhesive surface 440, and, by extension, any objects adhered to the electroadhesive surface 440. The load-bearing frame 430 can function to receive and/or redistribute stress forces on the electroadhesive surface 440 to the structural members of the load-bearing frame 430. In some examples, the electroadhesive gripping surface 440 may be connected to the pins 432 in the load-bearing frame 430 through a deformable layer (e.g., the deformable layer 532 in FIG. 5) to allow the gripping surface 440 to conform to exterior surfaces of items being manipulated while distributing forces between connection points with adjacent ones of the pins 432. In some cases, the load bearing frame 430 may be a substantially flat member (e.g., a rigid plate). Additionally or alternatively, the load-bearing frame 430 may be wholly or partially curved into a spherical or cylindrical or other complex shape. The pins 432 sliding in and out at each point (and corresponding channels 434) can be oriented to allow the gripping surface 440 to an object making contact with the gripping surface 440. In some cases, the pins 432 may be locally perpendicular to the surface of the frame 430 or may be substantially parallel to one another. Moreover, the frame 430 may have some conformance and be able to change shape (e.g., go from flat to curved). Such shape changing frames may further be able to be held/fixed in a desired shape so as to provide a stable platform for the pins 432 to slide through the channels 434, for example.

The controller 410 can include electronics and/or logic implemented as hardware and/or software modules to control operation of the pin-driven conformable gripping system 400. For example, the controller 410 can include a power supply interface 412 for controlling the voltage supply 420 whether to apply voltage to the electrodes 442 of the gripping surface 440. The voltage supply interface 412 may be configured to operate a switch (or switches) connecting the output of the voltage supply 420 to the terminals 444 of the gripping surface 440 (or perhaps switches within the voltage supply 420). Moreover, the voltage supply interface 412 may specify a magnitude of voltage to be applied to the electrodes 442. The voltage supply interface 412 may send instructions to the voltage supply 420 to cause the voltage supply 420 to adjust the magnitude of voltage output to the terminals 444. Upon receiving instructions, the voltage supply 420 can be configured to apply the specified voltage to conductive wires or lines connected to the terminals 444. The applied voltage can be a DC or AC voltage, which can provide opposing polarity on the electrodes 442 in the gripping surface 440 and thereby cause the gripping surface 440 to induce corresponding polarization in a foreign object loaded on the gripping surface 440. In some cases, a current supply that determines the appropriate current and corresponding voltage that produces intimate contact with the item being handled may be used to replace or augment the voltage supply 420. The polarized electrodes 442 and corresponding induced polarization of the loaded object results in an electroadhesive attraction between the gripping surface 440 and the foreign object. Using the voltage supply interface 412 to cause the voltage supply 420 to apply voltage to the terminals 444 can thus be considered turning on the electroadhesive gripping system 400. Similarly, causing the voltage to cease being applied to the terminals 444 (e.g., by turning off or disconnecting the voltage supply 420, or reducing the magnitude of the applied voltage, etc.) can be considered turning off the electroadhesive gripping system 400.

The controller 410 may also include a positioning interface 414 configured to control the position of the load-bearing frame 430 via instructions to the positioning system 416. For example, the controller 410 can instruct one or more position motors (e.g., servo motors, hydraulically driven arms, or the like) in the positioning system 416 to adjust the position of the load-bearing frame 430. The frame 430 is coupled to the gripping surface 440 via the height-adjustable pins 432, so the positioning interface 416 can be used to control the location and/or orientation of the gripping surface 440. However, the shape of the gripping surface 440 can be further adjusted by adjustment of the pins 432 within their respective channels 434.

The controller 410 may also include an item sensor (not shown). The item sensor can include one or more sensors and/or detectors configured to output data indicative of a loading condition of the pin-driven electroadhesive gripping system 400. For example, the item sensor may detect whether any foreign objects are adhered to (or proximate to) the electroadhesive gripping surface 440. The item sensor may include sensors to detect indications of surface capacitance, opacity, thermistor-based slip sensors, etc. The item sensor may additionally or alternatively detect sliding of one or more of the pins 432 within their channels 434, which may indicate that the flexible electroadhesive surface 440 is being pushed against a foreign object. The item sensor can output data indicating that an item is detected, and the data can be used by the controller 410 to determine instructions to send to the voltage supply 420 and/or positioning system 416. For example, the controller 410 can determine a voltage to be applied to the electrodes 442 (and/or whether to apply such a voltage) based on indication(s) from the item sensor.

Figure 4B:
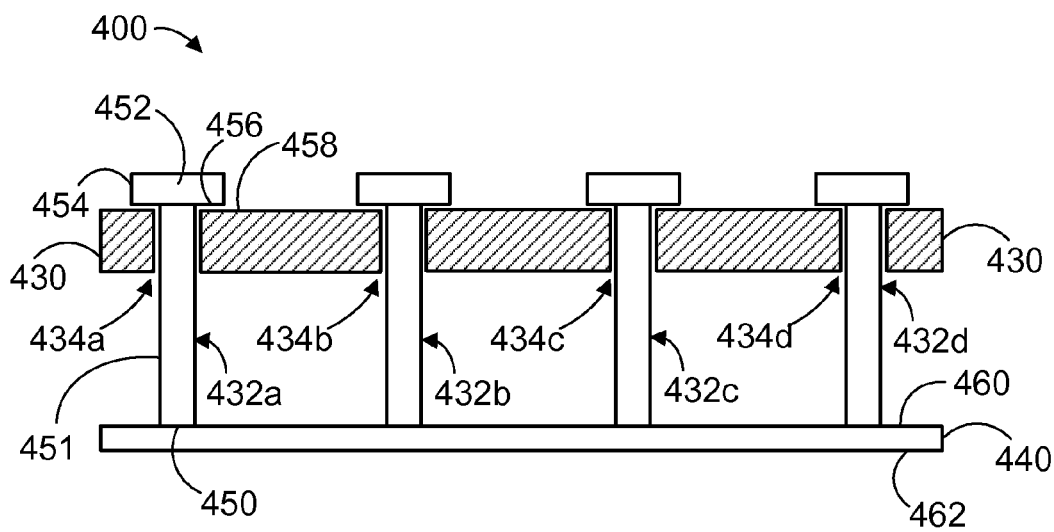
FIG. 4B illustrates a side-cross-sectional view of an example pin-driven conformable gripper.

FIG. 4B illustrates an example embodiment of the pin-driven conformable gripping system 400. FIG. 4B illustrates a side cross-sectional view of an electroadhesive surface 440 coupled to a load-bearing frame 430 via several pins 432*a-d* configured to slide within respective channels 434*a-d* in the frame 430. The frame 430 can be mounted on a mobile robot, tracked vehicle, stacked crane, gantry, mobile cart, end of a forklift truck, mobile scissor lift or any other method that may allow the frame 430 to be positioned and/or oriented in three dimensions. The electroadhesive surface 440 includes an electroadhesive gripping side 462 and an opposing back side 460. Electrodes 442 in the electroadhesive surface 440 can be polarized to cause the gripping side 462 to adhere to an item near to the gripping side via induced electroadhesive attraction. Similar to the descriptions of electroadhesive gripping surfaces provided above, the electrodes may be coated with an insulating material to protect both the electrodes and the objects in contact with the gripping surface 462 and also to prevent discharge of the electrodes.

The pins 432*a-d* can each be similar and the height-adjustable pin 432*a* is described by way of example. The height-adjustable pin 432*a* includes a first end 450 and a second end 452. A shaft 451 connects the first and second ends 450, 452. The first end 450 is coupled to the back side 460 of the electroadhesive surface 440. The pin 432*a* slides within its channel 434*a* to adjust the local separation distance between the frame 430 and the electroadhesive surface 440, and thereby change the shape of the gripping surface 462. In particular, the shaft 451 of the pin 432*a* slides along an inner wall of the channel 434*a*. In some cases, the frame 430 may not be a single plate with a continuous interior sidewall to form a channel. In some cases, the frame 430 may include two separate thinner plates that are separated from each other by a gap so as together form a channel comprising of two separated holes in the respective guide plates for the pins 432 to slide in.

The second end 452 of the pin 432*a* includes a retaining cuff 454 that prevents the pin 432*a* from being entirely withdrawn from the channel 434*a* by engagement with the frame 430. The retaining cuff 454 may have a diameter larger than the opening of the channel 434*a*, for example. As a result, an engagement surface 456 of the cuff 454 that extends outward from the sidewall of the pin 432*a* contacts a back surface 458 of the frame 430 to stop the pin 432*a* from extending beyond a maximum extension. In some examples, the pin 432*a* may be a cylinder and the retaining cuff 454 can be a sleeve that fits over the second end 452 and has a larger diameter than the portion of the pin 432*a* that slides within the channel 434*a*.

When positioned near an item, the gripping system 400 can be moved toward the item, via manipulation of the frame 430. Upon the electroadhesive surface 440 making contact with the item, the item pushes against the electroadhesive surface and the individual pins 432*a-d* slide within their respective channels 434*a-d* to allow the electroadhesive surface 440 to conform to the exterior shape of the item. Electroadhesion can then be activated by applying opposing polarity voltage to the electrodes 442 sufficient to induce a complementary local electrical polarization in the item. The resulting electroadhesive attraction between the item and the gripping surface 440 causes the item and the gripping surface to adhere to one another. In an example in which the system 400 is equipped with a pin-locking mechanism 436 (not shown in FIG. 4B), the heights of the pins 432*a-d* can be locked prior to manipulating the item by moving the load-bearing frame 430. As such, the item-specific conformance of the gripping surface 440 due to the sliding height-adjustment pins 432*a-d* can be maintained even as the load-bearing frame 430 is lifted, re-positioned, and otherwise manipulated via the positioning system 416, during which time the adhered item does not generally continue to exert a force on the pins 432*a-d*. Further examples of such interactions are provided herein.

Figure 4C:
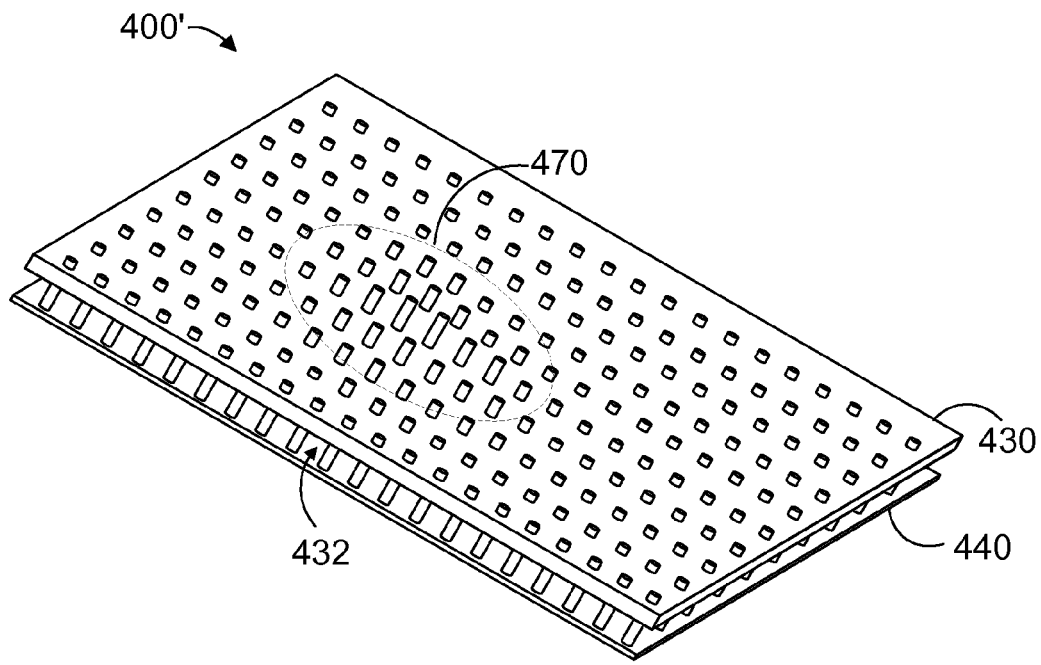
FIG. 4C illustrates a top aspect view an example pin-driven conformable gripper with a two-dimensional pin array extending through a plate.
Figure 4D:
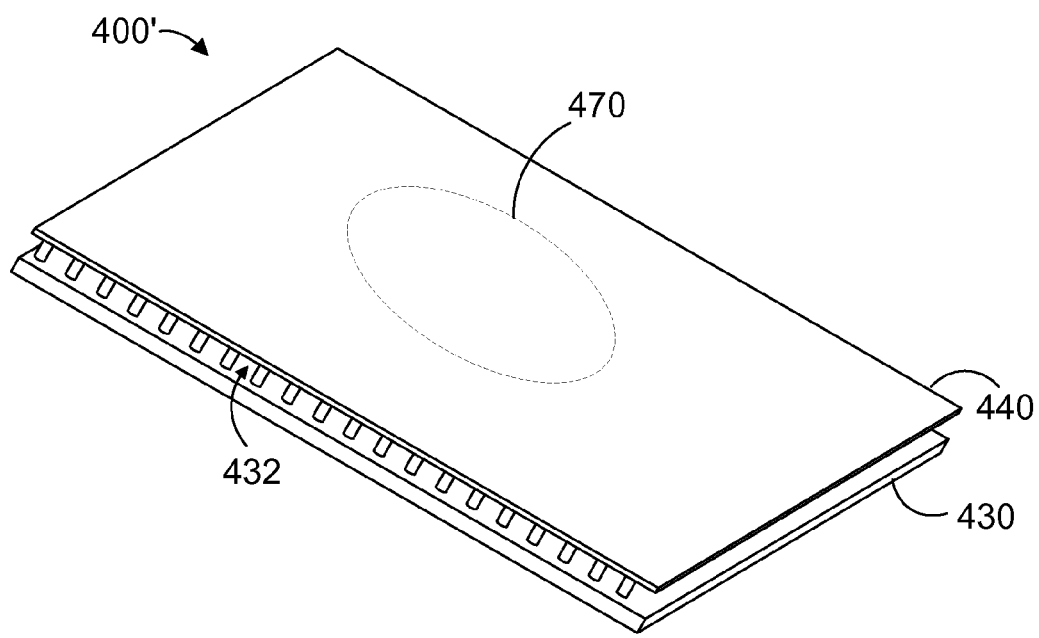
FIG. 4D illustrates a bottom aspect view the example gripper of FIG. 4C.

FIG. 4C illustrates a top aspect view an example pin-driven conformable gripper 400' with a two-dimensional pin array 432 extending through a frame 430 to couple to an electroadhesive surface 440. FIG. 4D illustrates a bottom aspect view the example gripper of FIG. 4C. The frame 430 can be a substantially rigid plate having an array of channels configured to receive the pins 432. The electroadhesive surface 430 can include a flexible sheet with one or more electrodes configured to be polarized by the voltage supply 420. A subsection 470 of the gripper 400' includes pins that are deflected through the backside of the frame 430 so as to deform the gripping surface 440 in a concave shape. For example, if the back frame 430 is substantially flat, and the pins 432 are all approximately the same lengths, then the subsection 470 in which the pins extend relatively further through the backside (as shown in FIG. 4C) corresponds to a region in which electroadhesive surface 430 is somewhat indented relative to surrounding regions. For example, the distance between the electroadhesive surface 440 and the frame 430 may be relatively less in the subsection 470, than in surrounding regions in which the pins 432 are near their respective maximum extension points. This conformance of the pins may be exercised during pick-up of complex shaped objects in some cases. In other cases, the pickup may be substantially flat for a flexible substrate (such as a fabric) but the conformance may be exercised while placing the flexible substrate onto a complex shaped surface (such as curved mold) before releasing the flexible substrate onto the complex shaped surface.

In some examples, the pins 432 (and their corresponding channels) are oriented substantially in parallel. As a result, height-adjustments across the electroadhesive gripping surface 440 due to movement of the pins 432 within their respective channels are carried out in a parallel direction. When conforming the gripping surface 440 around a foreign object, such conformance is facilitated by moving the gripper 400' toward the foreign object while the pins 432 move parallel to the direction in which they are able to slide (i.e., the direction of motion within their respective channels). The force imparted by contact with the foreign object is then directed substantially along the direction of motion of the pins in the array, which facilitates sliding of particular pins to create a conformed surface particular to the foreign object.

3a) Passive Pin Array

A pin-driven electroadhesive gripper 500 with a passive pin array 520 is described next in connection with FIGS. 5A-5C. The passive pin array 520 may be an array of height-adjustable pins that are able to slide within respective channels in a load-bearing frame 510 without exceeding a maximum extension, similar to the pins 432 described above in connection with FIG. 4. For example, the pins 520 may include retaining cuffs or another extension stopping mechanism to prevent the pins from being entirely withdrawn from their respective channels in the frame 510 via mechanical engagement with a portion of the frame 510. The passive pin array 520 couples the frame 510 to a flexible electroadhesive gripping surface 530. A deformable layer 532 may be adhered to a backside of the gripping surface 530 to facilitate force conveyance and distribution between the pins 520 and the gripping surface 530.

The passive pin array 520 is operated without using a pin-locking mechanism to fix the position of the pins (and thus the shape of the electroadhesive surface). The gripper 500 may therefore lack such a pin-locking mechanism, or it may be disabled or unused. FIGS. 5A-5C illustrate a sequence in which an example passive pin array equipped gripper 500 is used to pick up a flexible sheet 540 and place the sheet 540 on a curved target surface 550. Because the height-adjustable pin array allows the electroadhesive gripping surface to conform to the curved target surface 550 before releasing the sheet 540, the sheet 540 can be carefully positioned on the target surface 550 without dropping the sheet 540 from a height.

Figure 5A:
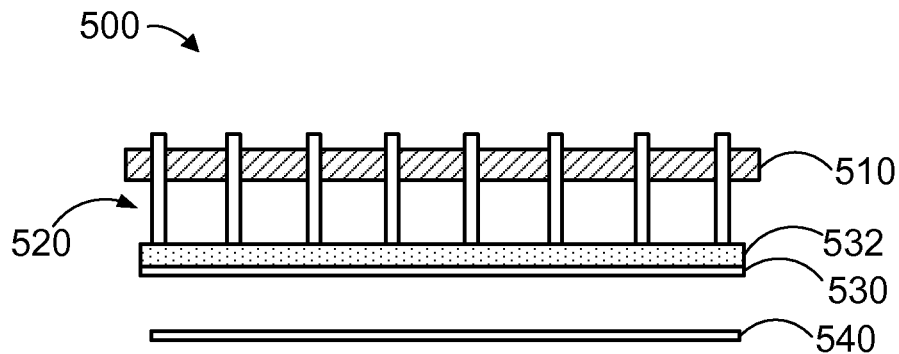
FIG. 5A illustrates a side cross-sectional view of an example passive pin-driven conformable gripper approaching a sheet.

FIG. 5A illustrates a side cross-sectional view of the example passive pin-driven conformable gripper 500 approaching a sheet 540. The passive pin-driven conformable gripper 500 includes a flexible electroadhesive gripping surface 530 coupled to a load-bearing frame 510 via an array of pins 520. The pins 520 are configured to slide within channels formed in the frame 510. Each pin's sliding motion results in a height adjustment of a corresponding portion of the gripping surface 530 and thereby allows the gripping surface 530 to conform to an object pressing against the electroadhesive surface 530. The electroadhesive gripping surface 530 includes one or more electrodes configured to be polarized sufficient to induce an electroadhesive attraction with an object near to the gripping surface 530 (e.g., the sheet 540). Similar to the descriptions of electroadhesive gripping surfaces provided above, the electrodes may be coated with an insulating material to protect both the electrodes and the objects in contact with the gripping surface and also to prevent discharge of the electrodes.

As shown in FIG. 5A, a deformable layer 532 may be adhered to the backing of the electroadhesive gripping surface 530. The deformable layer 532 is also coupled to the pins 520 and therefore conveys and distributes forces between the load-bearing frame 510 (via the pins 520) and the gripping surface 530. The deformable layer 532 may be a foam material, an elastomeric material, or another flexible or semi-rigid material that enhances the structural integrity of the gripping surface 530 by conveying the forces on the gripping surface 530 to the spatially separated pins 520.

Figure 5B:
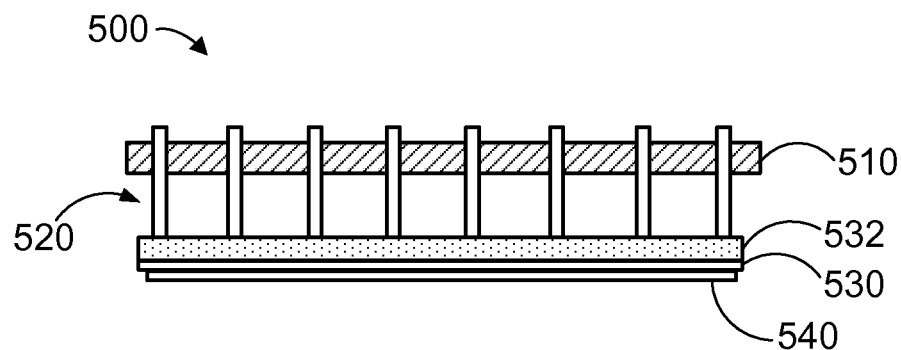
FIG. 5B illustrates the gripper of FIG. 5A adhered to a sheet.

FIG. 5B illustrates the gripper 500 of FIG. 5A adhered to the sheet 540. The gripper 500 is moved downward until the gripping surface 530 contacts (or nearly contacts) the sheet 540. The downward motion can be caused by manipulation of the load-bearing frame 510, which can be generated by operation of a control arm, gantry, or other positioning system (e.g., the positioning system 416 described in connection with FIG. 4). Once the gripping surface 530 contacts the sheet 540, the electroadhesive gripping surface 530 can be turned on (via application of polarizing voltage to electrodes in the gripping surface 530), and the resulting attraction between the sheet 540 and the gripping surface 530 allows the sheet 540 to be lifted by the gripper 540.

Figure 5C:
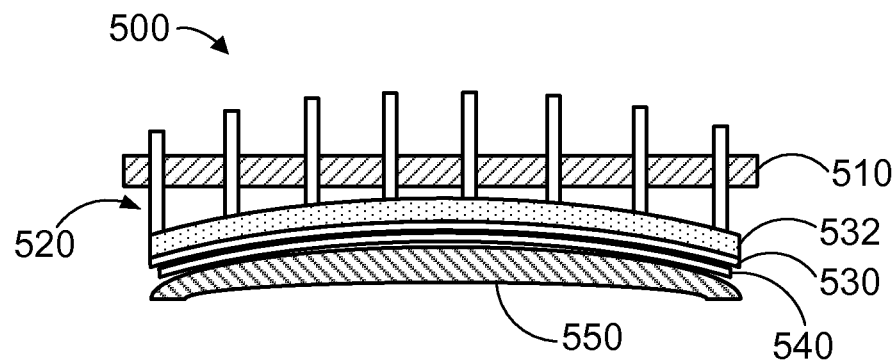
FIG. 5C illustrates the gripper of FIG. 5A placing the sheet on a curved object.

FIG. 5C illustrates the gripper of FIG. 5A placing the sheet on a curved target surface 550. The gripper 500 is moved over the curved target surface 550 and then moved downward to place the sheet 540 on the curved target surface 550. The motion of the gripper 500 can be caused by manipulation of the load-bearing frame 510. During placement, the sheet 540 is secured to the electroadhesive gripping surface 530 via the induced electroadhesive attraction between the two. Upon contact with the curved target surface 550, the pins 520 over the highest points on the target surface 550 passively slide through their respective channels to cause the gripping surface 530 (and adhered sheet 540) to conform to the target surface 550. The flexible gripping surface 530 and deformable layer 532 deflect to adopt the shape of the target surface 550. As the gripper 500 continues moving downward, force from the curved target surface 550 causes the pins 520 to continue sliding, and the gripping surface 530 to continue conforming. The gripper 500 stops moving downward once the entire gripping surface 530 is substantially conformed to the target surface 550 or upon one of the pins 520 reaching a maximum displacement through its channel (e.g., a point at which the deformable surface 532 contacts the frame 510 and the nearest pins can therefore no longer slide upward). A sensor may be employed to detect a maximum deflection of any of the pins 520, and generate an indication of the maximum detection, which can then cause the gripper 500 to stop moving downward (e.g., via a controller with a positioning interface similar to the discussion in connection with FIG. 4).

Once the sheet 540 is conformed to the target surface 550 and placed in the proper position, the gripper 500 can deactivate electroadhesion, and the sheet 540 can be released from the gripper 500. For example, the gripper 500 may turn off or reduce the polarizing voltage applied to electrodes in the gripping surface 530. The gripper 500 can then separate from the sheet 540 by lifting upward. The sheet 540 remains in place in the position in the conformed shape it was positioned in by the gripper 500. As the gripper 500 lifts off of the target surface 550, the pins 520 can fall back downward under the force of gravity such that the flexible electroadhesive surface 530 returns again to the configuration shown in FIG. 5A (e.g., a substantially flat surface or another surface defined by the shape of the frame 510 and the respective lengths of the pins 520). In some cases, the return of the pins 520 to their respective starting positions (e.g., maximum extension positions) may be facilitated by biasing devices, such as springs, and other elastic devices) that urge the pins toward their respective starting positions. An example of a pin-driven conformable electroadhesive device including biasing springs is described below in connection with FIG. 7.

The sheet 540 may be a thin flexible sheet, such as a textile fabric, a substrate formed of carbon fiber materials, filaments, etc. In some cases, the sheet 540 may be a carbon fiber substrate placed on the curved surface 550 during an assembly process for a carbon fiber object that involves placing laminated sheets of carbon fiber substrate and resin that cure to a solid form. For example, such structures may be incorporated into automotive body panels (e.g., hoods, doors, etc.), aviation body panels (e.g., wings, fuselages, etc.) and other structures formed from flexible substrates laminated together in an assembly process.

3b) Active Pin Array

A pin-driven electroadhesive gripper 600 with an active pin array 620 is described next. The active pin array 620 may be an array of height-adjustable pins that are able to slide within respective channels in a load-bearing frame 610 without exceeding a maximum extension, similar to the pins 432 described above in connection with FIG. 4. For example, the pins 620 may include retaining cuffs or another extension stopping mechanism to prevent the pins from being entirely withdrawn from their respective channels in the frame 610 via mechanical engagement with a portion of the frame 610. The active pin array 620 couples the frame 610 to a flexible electroadhesive gripping surface 630. A deformable layer 632 may be adhered to a backside of the gripping surface 630 to facilitate force conveyance and distribution between the pins 620 and the gripping surface 630.

The active pin array 620 also includes a pin-locking mechanism (not visible in FIG. 6) that operates to selectively fix the position of the pins 620 (and thus the shape of the electroadhesive surface 630). Examples of pin-locking mechanisms are described below in connection with FIGS. 7-8. FIGS. 6A-6D illustrate a sequence in which the gripper 600 is used to conform to an object 640, lift the object, and maintain the item-specific conformance while the object 640 is lifted and manipulated, and optionally following release of the object 640. Because the active height-adjustable pin array 620 enables the electroadhesive gripping surface 630 to hold a particular object-specific shape, the gripper 600 allows for adapting the gripping surface 630 to a generic object-specific shape without having prior knowledge of the particular object.

Figure 6A:
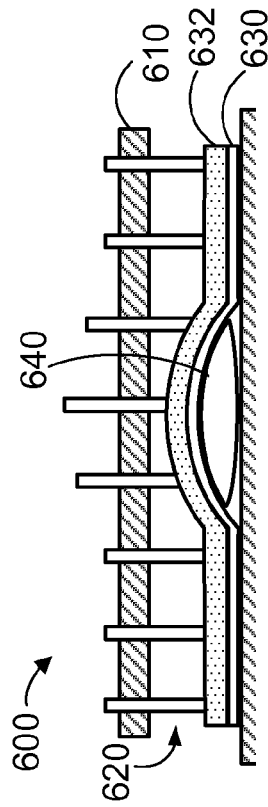
FIG. 6A illustrates a side cross-sectional view of an example active pin-driven conformable gripper approaching an object.

FIG. 6A illustrates a side cross-sectional view of the example active pin-driven conformable gripper 600 approaching an object 640. The gripper 600 is positioned over the object 630 via manipulation of the frame 610. The gripper 600 is oriented such that moving the gripper 600 toward the object 640, in a downward direction, also moves the pins 620 parallel to the direction of motion of the pins 620 sliding in their respective channels.

Figure 6B:
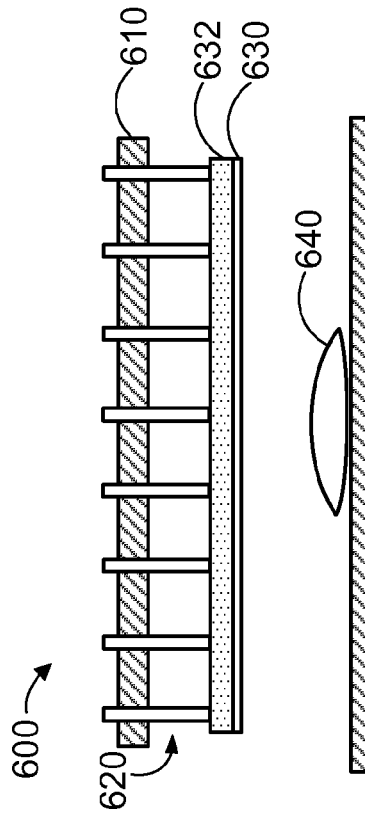
FIG. 6B illustrates the gripper of FIG. 6A conformed to the object.

FIG. 6B illustrates the gripper 600 of FIG. 6A conformed to the object 640. The gripper 600 is moved downward until the gripping surface 630 contacts the object 640. Once the gripping surface 630 contacts the object 640, the pins over the highest points on the object 640 begin to slide in their respective channels to allow the gripping surface 630 to flex and conform around the object 640. As the gripper 600 continues moving downward, force from the object 640 causes the pins in the pin array 620 to continue sliding upward so as to conform the gripping surface 630 to the object 640. The gripper 600 stops moving downward once the gripping surface 630 is substantially conformed to the object 640 or upon one of the pins 620 reaching a maximum displacement through its channel (e.g., a point at which the deformable surface 632 contacts the frame 610 and the nearest pins can therefore no longer slide upward within their channels due to the interference). In some cases, a sensor may be employed to detect a maximum deflection of any of the pins 620, and generate an indication of the maximum detection, which can then cause the gripper 600 to stop moving downward (e.g., via a controller with a positioning interface similar to the discussion in connection with FIG. 4).

The electroadhesive gripping surface 630 is turned on by application of polarizing voltage to the electrodes in the gripping surface 630. The polarized electrodes induce a corresponding local electrical polarization in the object 640, and the object 640 is electroadhesively attracted to the gripping surface 640. The electroadhesive gripping surface 630 may be activated before the gripping surface 630 first makes contact with the object 640, after the gripping surface 630 is conformed to the object 640, or during the conformance operation. In some cases, the deflection of one or more of the pins 620 during conformance of the electroadhesive gripping surface 630 to the object 640, may be detected as an indication of contact with the object 640 and used as a signal to activate electroadhesion. Additionally or alternatively, the electroadhesive gripping surface 640 may be configured to turn on electroadhesion to particular subsections of the gripping surface 630 separately (e.g., via separately addressable electrodes for each subsection). The deflection of one or more of the pins 620 in a particular subsection may be used to turn on electroadhesion to the involved subsections.

Figure 6C:
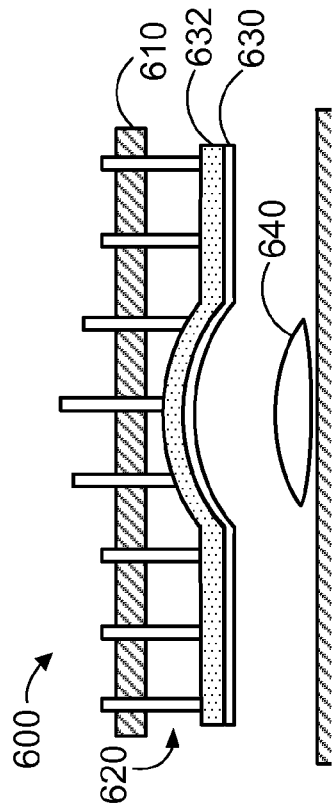
FIG. 6C illustrates the gripper of FIG. 6A lifting the object.

FIG. 6C illustrates the gripper 600 of FIG. 6A lifting the object 640. Before lifting the object 640, the pins 620 are locked in position so as to cause the shape of the electroadhesive surface 630 remain fixed as the gripper 600 is lifted. Thus, prior to lifting, a pin-locking mechanism is activated to lock the pins 620 in position with respect to their corresponding channels and thereby fix the gripping surface 630 in its object-specific shape as the gripper 600 lifts the object 640. The locking of the pins 620 may be carried out by a ratcheting locking mechanism or an electroadhesive locking mechanism such as those described in connection with FIGS. 7-8 herein. In some cases, the pins 620 are locked so as to resist withdrawal, but not to resist further insertion. Such a one-way locking mechanism may be implemented with a ratcheting mechanism configured to engage angled teeth on the pins while the pins are being withdrawn, but not while they are being inserted.

Once the electroadhesive gripping surface 630 is activated (so as to adhere the object 640 to the gripping surface 630), and the pins 620 are fixed in position (so as to maintain the object-specific conformance of the gripping surface 630), the gripper 600 can be used to manipulate the object 640. For example, the gripper 600 can be moved upward to lift the object 640. The upward movement of the gripper 600 may be performed by manipulation of the load-bearing frame 610, for example.

Figure 6D:
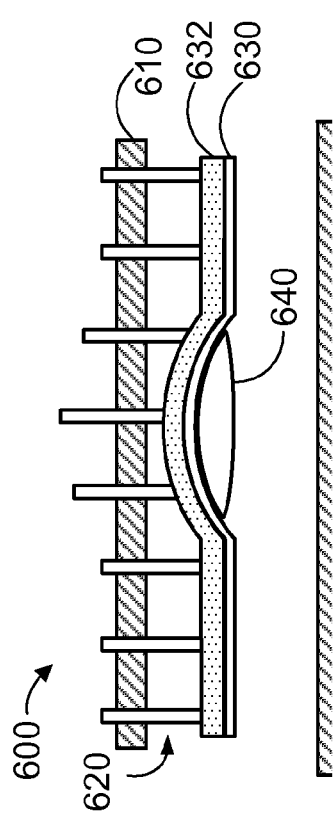
FIG. 6D illustrates the gripper of FIG. 6A releasing the object yet continuing to hold the conformed shape.

FIG. 6D illustrates the gripper 600 of FIG. 6A releasing the object 640 yet continuing to hold the conformed object-specific shape. The electroadhesive gripping surface 630 is turned off by turning off or reducing the voltage applied to the electrodes in the gripping surface 630. The object 640 therefore ceases to be attracted to the gripping surface 630 and falls away from the gripper 600. However, the pin-locking mechanism remains engaged to hold the pins 620 in their respective positions to hold the object-specific shape of the gripping surface 630. In some cases, the conformed gripper 600 can then be used to adhere to the same object or a similarly shaped object without the need for re-setting the pin array 620. In some cases, the conformed gripper 600 can be re-set, prior to adhering to another object, by releasing the pin-locking mechanism to allow the pins 620 to return to their maximum extension positions. Additionally, unlocking of the pins 620 simultaneously with turning off the electroadhesive voltage can result in the object 640 being physically ejected or peeled off from the electroahesive surface 630 and can result in faster release than achieved by only turning off the voltage to the electroadhesive surface 630. Upon resetting, the gripping surface 630 returns to its initial shape, as shown in FIG. 6A. The resetting action may be facilitated by the force of gravity urging the pins 620 downward in their respective channels upon the pin-locking mechanism being disengaged. The resetting action may also be optionally facilitated by one or more biasing device, such as compression springs or other elastic members situated to urge the pins 620 outward (e.g., downward in FIG. 6) toward their maximum extension positions.

The object 640 may be a complex or irregularly shaped object, such as an article of clothing (e.g., hat, shoe, accessory, etc.), or another irregularly shaped object lacking smooth, regular surfaces. Because the active pin array 620 enables the gripper 600 to both conform to an object being gripped, and to hold the conformance during manipulation of the object, the gripper 620 is able to securely hold and manipulate such irregularly shaped objects. As a result, processing, assembly, and handling operations of such irregularly shaped objects may be automated using electroadhesive grippers with such an active pin array.

IV. Pin Array Locking Mechanism

As noted above in connection with the active pin-array of FIG. 6, some pin-driven conformably gripping systems described herein include pin-locking mechanisms to secure the position of pins with respect to their channels and thereby hold a particular shape of the electroadhesive gripping service. Some embodiments include a ratcheting locking system that engages angled teeth on the pins to hold the pins in place. The angled teeth on the pins and/or the engaging features may be configured to allow the pins to advance within their channels, but not to be withdrawn back out. For example, angled teeth on the pin may be configured to urge a ratcheting engaging feature out of the way while the pin is inserted into its channel, but then catch the same feature when the pin is withdrawn back out. Such a one-way ratcheting system allows a gripper to conform to an object while being pushed down over the object, and the resulting force from the object pushes the pins into their channels. The gripper then holds the object-specific shape when the gripper is lifted off the object and gravity pulls on the pins to withdraw from their respective channels. The ratcheting mechanism can then re-set by disengaging the angled teeth and allow the pins to return to their initial positions (e.g., maximum extension positions).

Another embodiment includes an electroadhesive pin-locking mechanism. An electroadhesive strip is situated alongside the channels of the pins to cause, when energized, the outer sidewalls of the pins to be electroadhesively attracted to the inner walls of their respective channels. The electroadhesive attraction holds the pins in place with respect to the channels by shear forces conveyed via the electroadhesive strip. The electroadhesive strip may optionally be situated along the inner walls of the channels, or immediately adjacent to the inner walls. In some cases, a single electroadhesive strip can be extended between adjacent rows in an array of pins such that a single electroadhesive strip can be used to fix pins in the adjacent rows.

4a) Ratcheting Locking System

Figure 7A:
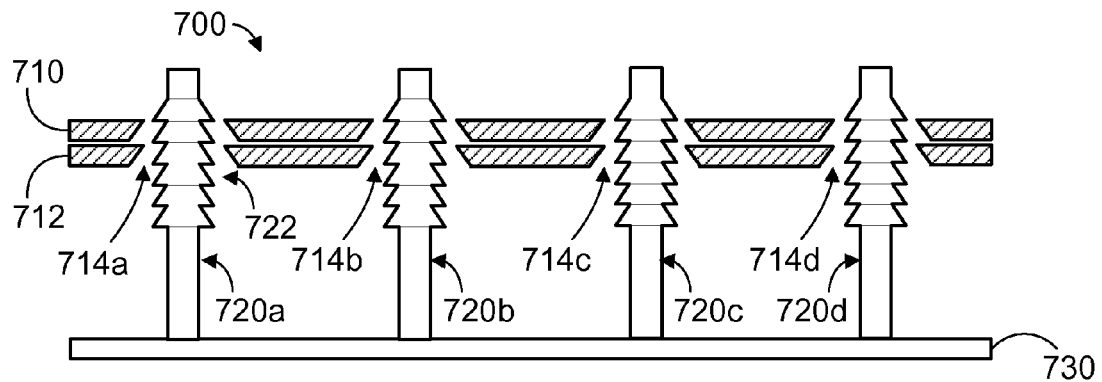
FIG. 7A illustrates an example ratcheting pin-locking mechanism configured to prevent pin withdrawal.

FIG. 7A illustrates an example embodiment 700 with a ratcheting pin-locking mechanism configured to prevent pin withdrawal. A flexible electroadhesive gripping surface 730 is coupled to a load-bearing frame via height-adjustable pins 720a-d. The load-bearing frame includes first and second plates 710, 712. One or both of the plates 710, 712 are configured to slide across the other. Each of the plates 710, 712 includes a pattern of apertures. Stacking the plates 710, 712 and aligning their respective apertures creates channels 714a-d for the pins 720a-d to move within. The dimensions, size, and/or position of the channels 714a-d can be adjusted by moving the plates 710, 712 relative to one another. For example, the channel diameter can be increased or decreased by sliding one plate relative to the other (e.g., in a sideways direction as shown in FIG. 7A). Sliding the plates 710, 712 relative to one another changes the alignment of the sets of apertures, and thereby changes the size of the channels 714a-d.

The pins 720a-d each include angled teeth along their sidewalls that are configured to engage portions of the plates 710, 712 to selectively lock the pins 720a-d from being withdrawn from the frame. The teeth 722 in the height-adjustable pin 720a have a pattern of angled faces that are configured to allow insertion of the pin 720a into the frame, and resist withdrawal of the pin 720a. For example, the faces of the angled teeth 722 and respective portions of the plates 710, 712 can be configured such that interaction between the two during insertion of the pin 720a urges the contacted portions of the plates 710, 712 side to side to allow passage of the pin 720a through its channel 714a. During withdrawal, by contrast, the angled teeth 722 are configured to engage the plates 710, 712 without creating a sideways force. The interaction between the angled teeth 722 of the height-adjustable pin 720a and the sliding plates 710, 712 are described further herein in connection with FIGS. 7B and 7C.

Figure 7B:
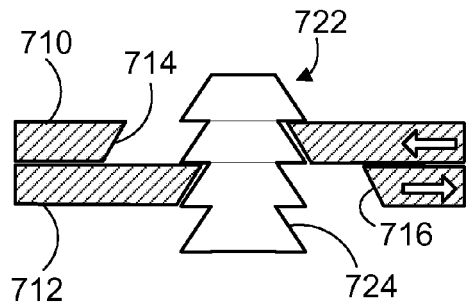
FIG. 7B illustrates an example ratcheting pin-locking mechanism in an engaged position.
Figure 7C:
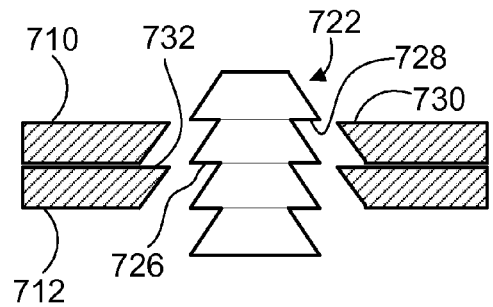
FIG. 7C illustrates an example ratcheting pin-locking mechanism in a reset position.

FIG. 7B illustrates an example ratcheting pin-locking mechanism in an engaged position. FIG. 7C illustrates an example ratcheting pin-locking mechanism in a reset position. The teeth 722 in the pin 720a have angled faces 724 that engage the inner walls of the channel 714a to allow insertion, but resist withdrawal. The inner walls of the channel 714a are formed by the inner side edges 714, 716 of aligned apertures in the top plate 710 and bottom plate 712. Both the inner side edges 714, 716 can have angled faces configured to engage the angled faces 724 of the teeth 722. In some examples, the angled faces 724 of the teeth 722 and the angled faces of the inner side edges 714, 716 may be approximately parallel surfaces (e.g., for those surfaces configured to engage one another). During insertion, the respective angled faces 724, 714, 716 of the teeth 722 and the plates 710, 712 slide past one another to allow the pin 720a to be inserted (e.g., by pushing the plates 710, 712 sideways out of the way of the pin 720a due to the normal force between the plates 710, 712 and the teeth 722). In other words, during insertion of the pin 720a, the normal interaction between the angled surfaces 724 and the inner side edges 714, 716 urges one or both of the plates 710, 712 to move in their direction of motion so as to increase the size of the channel 714a and allow passage of the pin 720a.

Both the teeth 722 and the plates 710, 712 can also include portions configured to engage one another so as to resist withdrawal of the pin 720a from its channel. The teeth 722 can include a series of transverse surfaces 726, 728 between the angled faces 724. The transverse surfaces 726, 728 can be substantially transverse to the direction of motion of the pin 720a during withdrawal. The transverse surfaces 726, 728 of the teeth 722 can engage rims 730, 732 of the plates 710, 712 during withdrawal. The rim 730 can be a region of the top plate immediately surrounding the aperture forming the channel 714a, and the rim 732 can be a region of the bottom plate 712 immediately surrounding the aperture. In some examples, the surface of the rims 730, 732 that engage the transverse surfaces 726, 728 may be substantially parallel to one another. Because the surface of the transverse surfaces 726, 728 and rims 730, 732 that engage one another to resist withdrawal are substantially perpendicular to the direction of motion of the pin 720a, movement of the pin does not urge the plates 710, 712 sideways (i.e., the normal force between transverse surfaces 726, 728 and the rims 730, 732 does not urge the plates 710, 712 to move in their direction of motion).

To engage the pin-locking mechanism, as shown in FIG. 7B, the plate 710 is moved relative to plate 712 (e.g., as indicated by the directional arrows in FIG. 7B). The movement of the plates 710, 712 decreases the size of the channel 714a. After the movement of the plates 710, 712, the top plate 710 engages the teeth 722 on one side, and the bottom plate 712 engages the teeth 722 on an opposite side. Once engaged, the interaction between the transverse surfaces 726, 728 and the rims 730, 732 resist withdrawal of the pin 720a. However, the pin 720a is still allowed to continue into the channel 714a, because the motion of the pin 720a during insertion moves the plates 710, 712 out of the way via engagement with the angled teeth 722.

During reset, as shown in FIG. 7C, the plates 710, 712 are moved to bring their respective apertures into alignment, to increase the size of the resulting channel 714a. The channel 714a can be made wide enough to allow the pin 720a to be withdrawn without interference with the teeth 722. The pin 720a can then move downward to its maximum extension position. In some examples, the pin 720a can move under the force of gravity or due to a biasing force from a biasing device, such as a compression spring.

Figure 7D:
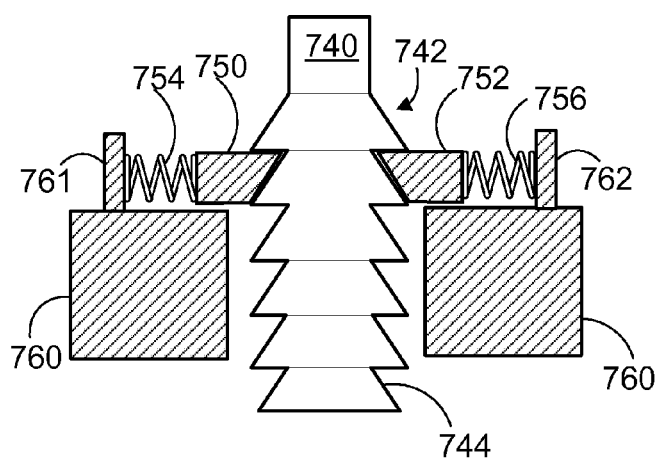
FIG. 7D illustrates another ratcheting pin-locking collar configured prevent pin withdrawal.

FIG. 7D illustrates another ratcheting pin-locking collar configured prevent pin withdrawal. A pin 740 passes through a channel in a frame 760. On one side of the frame 760, a ratcheting collar includes one or more locking arms 750, 752 biased inward, toward the pin 740 with biasing springs 754, 756. The biasing springs 754, 756 can be anchored against a collar (shown as sidewall elements 761, 762) or may be integrated into the frame 760. The locking arms 750, 752 are formed with angled surfaces configured to engage angled teeth 742 along the sidewall of the pin 740, similar to the angled teeth in the pin 720a described in connection with FIGS. 7A-7C. During insertion of the pin 740 into its channel, the angled faces 744 of the teeth 742 interface with the locking arms 750, 752 to push the locking arms 750, 752 against their biasing springs 754, 756, and allow the pin 740 to be inserted. However, once engaged, the locking arms 750, 752 resist withdrawal of the pin 740 be engaging transverse surfaces in the teeth 742. To reset the ratcheting collar shown in FIG. 7D, the locking arms 750, 752 may be moved to a non-interfering position (e.g., by moving the retaining portions 761, 762 outward, along the frame 760).

In some cases, the two plate load-bearing frame described in connection with FIGS. 7A-7C allows for engaging and re-setting the ratcheting mechanism of an entire pin-array by manipulation of one or both plates. For example, moving the top plate 710 to the engaged position simultaneously engages the ratcheting teeth of each of the pins 720a-d in an array by changing the dimensions of the channels 714a-d. Similarly, the entire array can be re-set by moving the top plate 710 to the reset position. A positioning system can be used to slide one or both plates 710, 712 relative to one another and thereby selectively engage and reset the ratcheting mechanism.

The ratcheting mechanism of FIGS. 7A-7D describe examples in which the pins 720a-d are equipped with fixed angled teeth along their respective sidewalls that are configured to engage the teeth. In some examples, to achieve the ratcheting effect, the frame portions the teeth engage with are configured to slide back and forth to allow passage of the angled teeth (at least during insertion). For example, interaction between the angled teeth 722 and the inner side walls 714, 716 push the plates 710, 712 sideways to allow the pin 710a to be inserted. In addition, the angled teeth 722 push the biased locking arms 750, 752 sideways to allow the pin to be inserted. However, some embodiments may additionally or alternatively employ spring-loaded teeth along the sidewalls of the pins 720a-d. For example, the teeth 722 may be configured to collapse when depressed against the angled surface 724, but not when pressure is applied to the transverse surfaces 726, 728.

4b) Electroadhesive Locking System

Figure 8A:
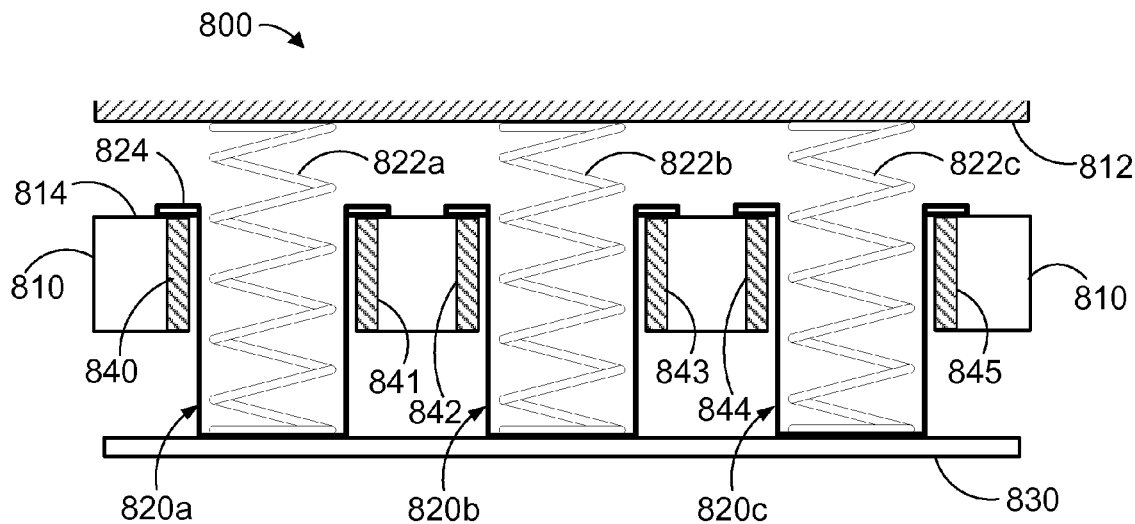
FIG. 8A illustrates an example electroadhesive pin-locking mechanism in a reset position.

FIG. 8A illustrates an example embodiment 800 with an electroadhesive pin-locking mechanism in a reset position. The electroadhesive gripping system includes an electroadhesive gripping surface 830 coupled to a load-bearing frame 810 by height-adjustable pins 820a-c. The pins 820a-c are biased in their maximum extension positions by compression springs 822a-c (although another biasing device or elastic material may be used). The compression springs 822a-c push the pins 820a-c outward away from a backing 812. The backing 812 can be a structural feature, such as a plate, that is fixed with respect to the frame 810. The frame 810 includes a pattern of channels that the pins 820a-c pass through. The frame 810 has a backside 814 that defines the maximum extension positions of the pins 820a-c. The pins 820a-c each includes a retaining cuff (e.g., the retaining cuff 824 on the pin 820a) that extends transverse to the sidewall of the pins 820a-c to prevent passage through the channels. The position of the pin 820a when the retaining cuff 824 contacts the backside 814 is therefore the maximum extension position for the pin 820a. Other pins in the array are arranged similarly with retaining cuffs or other features that engage portions of the frame 810 to prevent extension beyond a maximum position.

The frame 810 is equipped with one or more electroadhesive strips 840-845 along the inner walls of the inner sidewalls of the channels for the pins 820a-c. The electroadhesive strips 840-845 are shown in the cross-sectional view of FIG. 8A as hatched regions adjacent to the inner sidewalls of the channels. That is, the strips 840, 841 form a portion of the channel sidewall for the first pin 820a; the strips 842, 843 form a portion of the channel sidewall for the second pin 820b; and the strips 844, 845 form a portion of the channel sidewall for the third pin 820c. However, some embodiments may employ fewer electroadhesive pin-locking strips, such as one strip on one side of each channel. Moreover, some embodiments may share a single strip between multiple channels, such as by using a single electroadhesive strip to form a portion of the channels for both the adjacent pins 820a, 820b (e.g., a single electroadhesive strip that occupies the regions shown by 841 and 842). Further, a single electroadhesive strip may be wound through a pin array so as to be included in a portion of the sidewalls of multiple channels in the array. For example, a single electroadhesive strip may be wound through a pin array so as to simultaneously lock all pins in the array using the strip (examples in FIGS. 9A-9B). Additionally or alternatively, electroadhesive strips may be situated on the outer walls of the pins 820a-c, in which case the electroadhesive strips can optionally be omitted from the sidewalls of the channels 840-845. For example, electrodes configured to induce electrostatic attraction between the pins 820a-c and the channels 840-845 may be located on both of these structures (e.g., positive electrode on sidewall 840 and corresponding negative electrode on outer wall of the pin 820a or vice versa). In sum, electrodes, which may be integrated into one or more electroadhesive strips, are located on the pins 820a-c, the sidewalls 840-845, or some combination thereof so as to be able to electrostatically hold the position of the pins 820a-c relative to the frame 810 when a voltage is applied to the electrodes.

The electroadhesive strips 840-845 include one or more electrodes that, when energized, induce an electroadhesive attraction with the sidewalls of the pins 820a-c. The electroadhesive strips 840-845 are also coupled to the frame 810, and so the electroadhesive adhesion with the pins 820a-c holds the pins 820a-c in position within their respective channels. The shear forces on the electroadhesive strips 840-845 due to resisting movement of the pins 820a-c within their channels are conveyed, through the electroadhesive strips 840-845 to the frame 810 via a coupling mechanism that attaches the strips 840-845 to the frame 810. The electroadhesive strips 840-845 may be coupled using an adhesive, fasteners, etc., and may include one or more intermediate layers to allow the strips 840-845 to partially deform/conform with to the sidewalls of the pins 820a-c. Moreover, the strips 840-845 may be coated with insulating materials to preserve and/or protect the electrodes situated therein and prevent discharge of the electrodes through a short to the pins 820a-c. A coating may also be applied to lubricate the sliding interaction with the pins 820a-c.

Figure 8B:
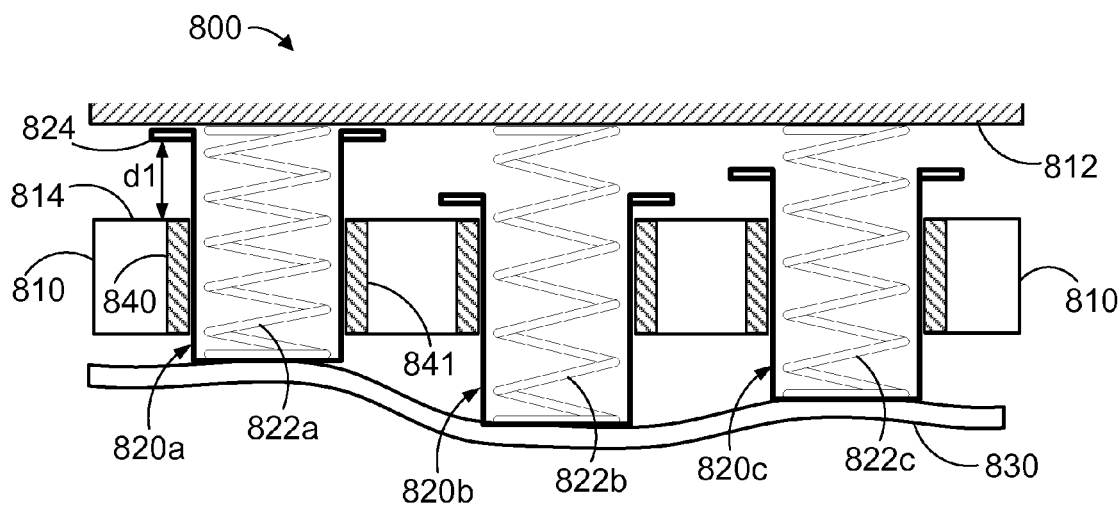
FIG. 8B illustrates an example electroadhesive pin-locking mechanism with pins held to prevent movement.

FIG. 8B illustrates the electroadhesive pin-locking mechanism holding the pins 820a-c to prevent movement. The electroadhesive gripping surface 830 is pressed against a foreign object, which causes the pins 820a-c to slide within their respective channels, against the force of their respective biasing springs 822a-c, until the electroadhesive surface 830 conforms to the foreign object. For example, the pin 820a is displaced by a distance d 1 (which is shown by the distance between the retaining cuff 824 and the backside surface 814 of the frame 810). Once the gripping surface 830 reaches the object-specific conformed shape, the electroadhesive pin-locking strips 840-845 can be turned on by applying a suitable polarizing voltage to the electrodes situated therein. The polarized electrodes in the strips 840-845 induce a corresponding local polarization in the sidewall of the pins 820a-c, and the resulting attraction between the pins 820a-c and the strips 840-845 holds the pins 820a-c in position and prevents further sliding. Activating the electroadhesive strips 840-845 thus fixes the shape of the gripping surface 830.

To reset the gripping device, the electroadhesive strips 840-845 are turned off or reduced, and the pins 820a-c then return to their positions of maximum extension under the restorative force of the springs 822a-c and/or under the influence of gravity.

In some examples, the electroadhesive gripping surface 830 and the electroadhesive pin-locking strips 840-845 may be energized simultaneously to both adhere to a foreign object and fix an object-specific shape of the gripping surface 830. Similarly, upon release of the adhered object, the electroadhesion of both the gripping surface 830 and the pin-locking strips 840-845 can be turned off simultaneously to both release the object and allow the pins to reset. In some cases, a single power control switching device may be used to apply voltage to both the gripping surface 830 and the pin-locking strips 840-845. In other examples, the pin-locking strips 840-845 and the gripping surface 830 may be separately turned on and off and at different times. For example, during adhesion to a foreign object, the gripping surface 830 may be turned on before the pins 820a-c are locked in place, or during release the pins 820a-c may be reset before the gripping surface 830 is turned off.

4c) Electroadhesive Locking System Array Configurations

Figure 9A:
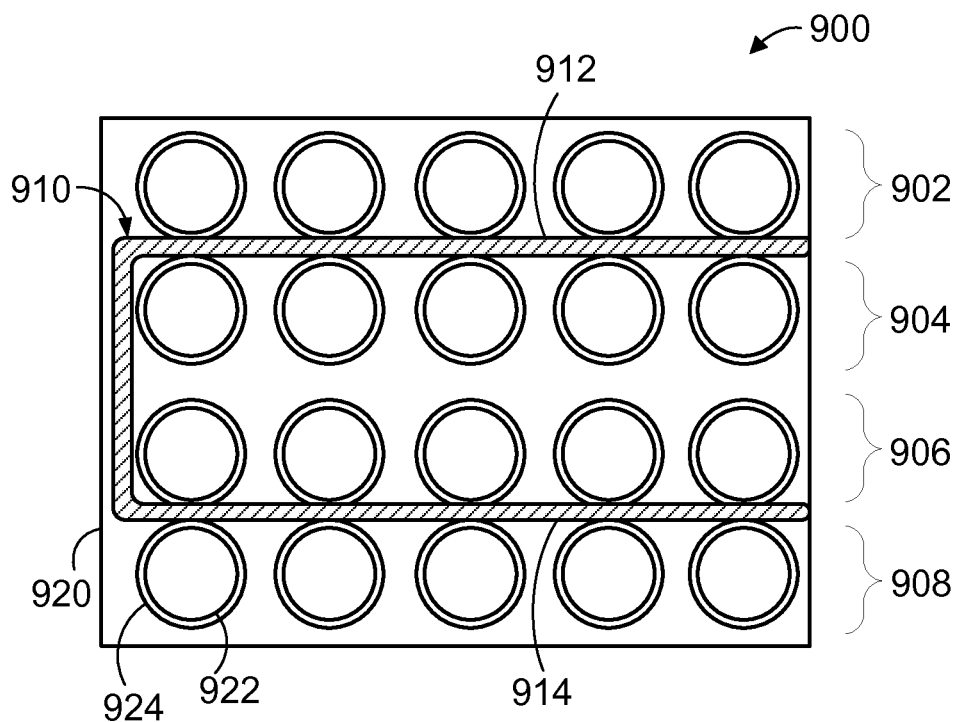
FIG. 9A illustrates an example arrangement for an electroadhesive pin-locking device in a two-dimensional pin array.

FIG. 9A illustrates an example arrangement 900 for an electroadhesive pin-locking device in a two-dimensional pin array. FIG. 9A is a cross-section through a plane of the frame 920. Cylindrical pins are situated within channels in the frame 950. The array of pins couple the frame 920 to an electroadhesive gripping surface (not shown). For example, the pin 922 in the lower left corner is situated within its channel 924. The pin array is arranged in rows and columns and includes a first row 902, second row 904, third row 906, and fourth row 908. A single pin-locking electroadhesive strip 910 has a first portion 912 that passes between the first and second rows 902, 904 and a second portion 914 that passes between the third and fourth rows 906, 908. The portion 912 that passes between the adjacent rows 902, 904 is able to lock the pins in both the first and second rows 902, 904 via simultaneous electroadhesion with the pins in both rows. The pin-locking strip 910 is arranged to form a portion of the channels in each row each row 902-908. For example, a top side of the channel 924 is formed by a tangential portion of the electroadhesive strip 910. As a result, applying voltage to the pin-locking strip 910 causes the entire pin array to be locked in position within their respective channels via induced adhesion to the tangential portion of the strip 910. While only four rows 902-908 are shown in the arrangement 900, additional rows may be added, and the strip 910 can be wound through the array between every other row and lock the entire pin array.

Figure 9B:
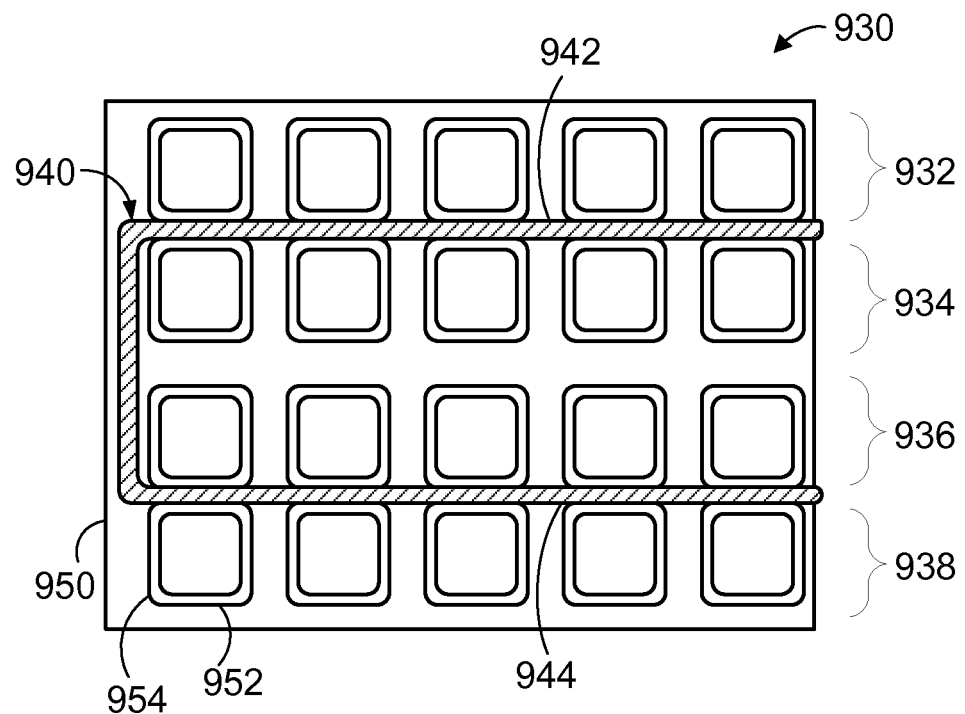
FIG. 9B illustrates a two-dimensional pin array with square pins.

FIG. 9B illustrates another example arrangement 930 for an electroadhesive pin-locking device with square pins. Like FIG. 9A, FIG. 9B is a cross-section through a plane of the frame 950. Square pins are situated within channels in the frame 950. The array of pins couple the frame 950 to an electroadhesive gripping surface (not shown). For example, the pin 952 in the lower left corner is situated within its channel 954. The pin array includes a first row 932, second row 934, third row 936, and fourth row 938. A single pin-locking electroadhesive strip 940 has a first portion 942 that passes between the first and second rows 932, 934 and a second portion 944 that passes between the third and fourth rows 936, 938. The pin-locking strip 940 is arranged to form a portion of the channels in each row each row 932-938. For example, a top side of the channel 954 is formed by the electroadhesive strip 940. Because the pins and their corresponding channels are square-shaped, the side surfaces of the pins/channels are flat, rather than rounded as in the arrangement of FIG. 9A. The flat sides of the square pins allow the electroadhesive strip 940 to adhere to a relatively larger area than is available for an alternative rounded pin shape. Because the strength of the electroadhesive attraction used to lock the pins is based, at least in part, on the overlapping areas between the electroadhesive strip 940 and the respective pins, the square pins allow for a relatively more secure hold by the pin-locking strip 940 as compared to the rounded pin shape. As a result, applying voltage to the pin-locking strip 940 causes the entire pin array to be securely held in position within their respective channels via induced adhesion to the locally tangential portion of the strip 940.

Similar results may be realized by using pins with just one flat sidewall edge (e.g., a half circle shape or the like). Pins in adjacent rows can then be situated with their respective flat sidewalls facing one another, and a pin-locking electroadhesive strip can be wound between the rows along the sides with flat sidewalls.

V. Alternative Configurations

As described herein, an array of height-adjustable pins configured to slide within channels of a load-bearing frame can be used to couple an electroadhesive gripping surface to the frame while allowing the gripping surface to conform to one or more objects to which the gripping surface is electrostatically adhered. However, alternative systems and techniques that do not use discrete height-adjustable pins for coupling a conformable electroadhesive gripping surface to a non-conformable load-bearing frame may be employed. For example, a particle-filled enclosure, similar in some respects to a bean bag, can couple an electroadhesive gripping surface to a frame. The particle-filled enclosure may be adhered on one side to the frame, and have an electroadhesive gripping surface adhered to an opposite side. Displacement of the particles (e.g., beans) within the enclosure allows the outside surface of the enclosure to conform to objects pressed against the side of the enclosure with the electroadhesive gripping surface. The particle-filled enclosure can thereby adopt an object-specific shape in which the electroadhesive gripping surface conforms to a particular object. Moreover, the particle-filled enclosure can be selectively locked in place by applying a vacuum pressure to the enclosure, which prevents the particles within from moving relative to one another, and effectively fixes the shape of the particle-filled enclosure. To reset the particle-filled enclosure, the enclosure can be re-filled with gas (or another fluid) to allow the particles within to move relative to one another, and thereby re-shape the exterior shape of the enclosure. Such a system may therefore include a pressure regulator for controlling the fluid pressure to the enclosure and selectively adding or removing fluid depending to fix or reset the shape of the enclosure.

In some examples, a flexible enclosure containing a fluid with adjustable viscosity may be used to couple the electroadhesive conformable gripping surface to a non-conformable frame. For example, an enclosure filled with an electrorheaological fluid, a magnetorheaological fluid, or another non-Newtonian fluid can be used. The filled enclosure is coupled on one side to the load-bearing frame and on an opposite side to a flexible electroadhesive gripping surface. While the fluid has a relatively low viscosity, the gripping surface can be pressed against an object, and the resulting force from the object causes the enclosure to deform to an object-specific shape in which the gripping surface conforms to the object. Once the enclosure is in a desired object-specific shape, a suitable stimulus can be applied to increase the viscosity of the fluid in the enclosure, which causes the shape of the enclosure to remain substantially fixed. For example, an electric field can be applied to increase the viscosity of an electrorheaological fluid, a magnetic field can be applied to increase the viscosity of a magnetorheaological fluid, or pressure or another stimulus can be applied to increase the viscosity of another non-Newtonian fluid. To reset the shape (e.g., during release of an adhered object), the viscosity-increasing stimulus can be removed (e.g., ceasing application of the electric or magnetic field, etc.) and the fluid can return to a relatively low viscosity, in which the outer surface of the enclosure are readily deformed.

VI. Example Operations

Figure 10A:
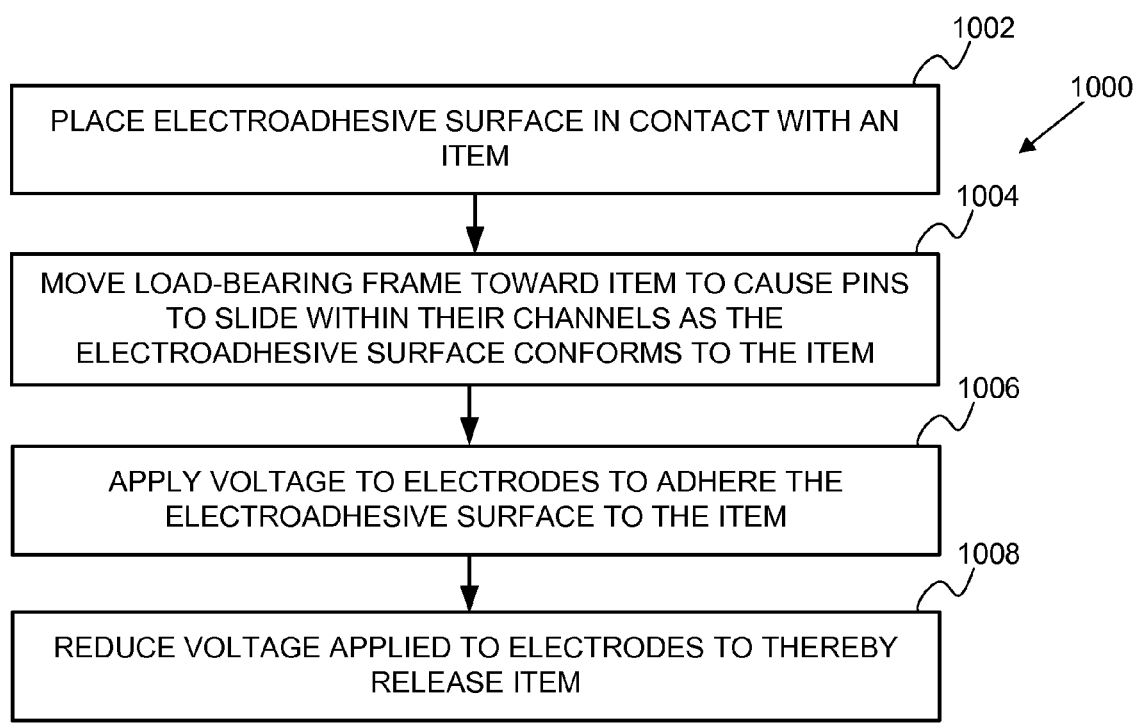
FIG. 10A is a flowchart of an example process for operating a pin-driven conformable electroadhesive gripper to manipulate an item.

FIG. 10A is a flowchart of an example process 1000 for operating a pin-driven conformable electroadhesive gripper to manipulate an item. The process 1000 may be performed by any of the conformable gripping systems and devices described herein in connection with FIGS. 4-9. An item is placed in contact with an electroadhesive surface of a gripping device (1002). The electroadhesive surface can be coupled to a load-bearing frame via an array of height-adjustable pins, which move within channels formed in the load-bearing frame to adjust the shape of the electroadhesive gripping surface. The load-bearing frame can then be moved toward the item, which causes certain ones of the pins to slide (e.g., retract) within their respective channels and thereby cause the electroadhesive surface to conform to the item (1004). In block 1004, the force of the item pushing against the electroadhesive surface as the load-bearing frame is moved toward the item can cause the pins to slide. A polarizing voltage can be applied to the electrodes in the electroadhesive gripping surface to adhere the electroadhesive surface to the item (1006). With the shape of the electroadhesive surface in the item-specific conformed shape, due to the process of block 1004, and the item adhered to the electroadhesive surface, due to the process of block 1006, the item can optionally be manipulated via the load-bearing frame while remaining securely held by the conformed gripper. Once the item is repositioned, re-oriented, or otherwise manipulated as desired, the voltage applied to the gripper electrodes is reduced to allow the item to detach from the electroadhesive surface (1008). In some examples, the item may be moved or otherwise manipulated prior to being released from the electroadhesive surface in block 1008. In some examples, the item may be secured in a substantially stationary, fixed position prior to being released from the electroadhesive surface in block 1008. Thus, the electroadhesion can be used to move and/or secure an adhered item.

In some examples, the load-bearing frame can be coupled to the electroadhesive surface via an enclosure filled with a fluid having reversibly adjustable viscosity, or by a particle-filled enclosure coupled to a pressure regulator to selectively allow freedom of movement by the particles. In such examples, the conformance of the electroadhesive surface in block 1004 can be performed by deformation of the enclosure via displacement of the fluid and/or particles within the enclosure.

Figure 10B:
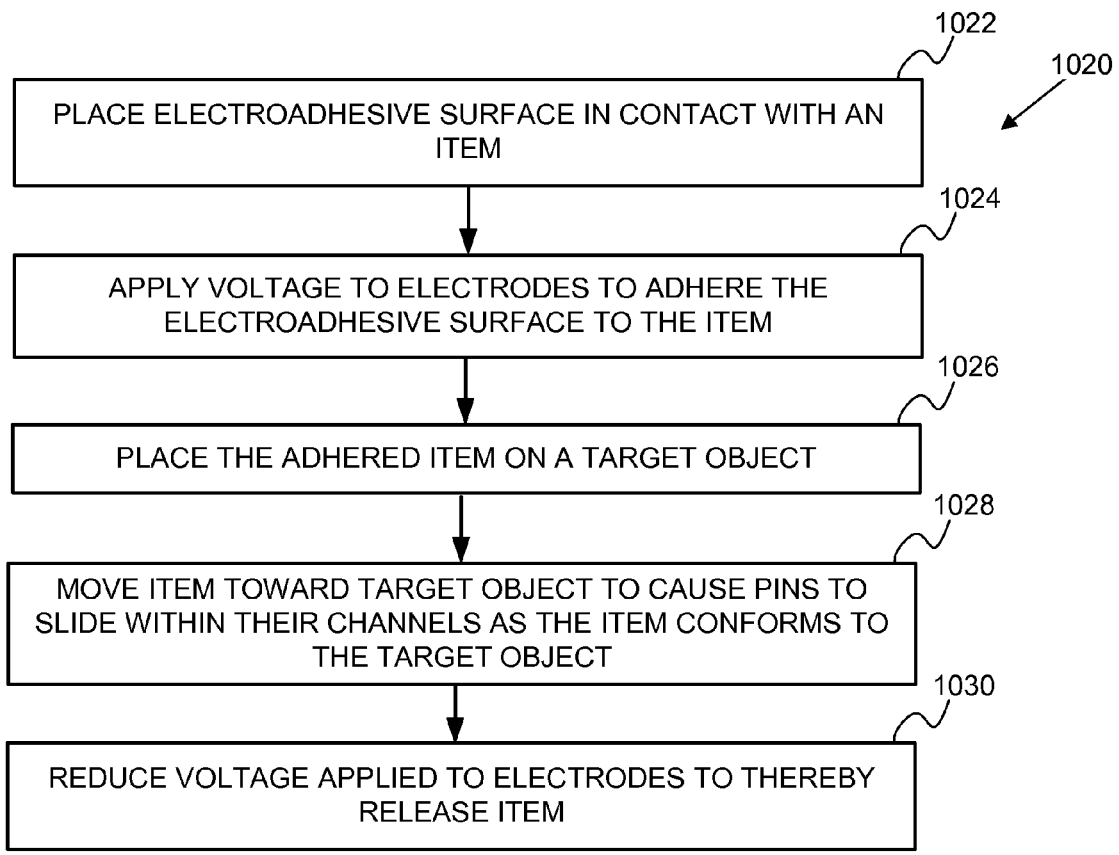
FIG. 10B is a flowchart of an example process for operating a passive pin-driven conformable gripper.

FIG. 10B is a flowchart of an example process 1020 for operating a passive pin-driven conformable gripper. The process 1020 may be performed, for example, by the passive conformable gripping system described in connection with FIG. 5. An item is placed in contact with an electroadhesive surface (1022). A polarizing voltage can be applied to electrodes in the electroadhesive surface to cause the item to adhere to the electroadhesive surface (1024). The item can then be manipulated via a load-bearing frame coupled to the electroadhesive surface and placed on a target object (1026). The load-bearing frame can then be moved toward the target object, which causes height-adjustable pins coupling the electroadhesive surface to the frame to slide within their respective channels so as to allow the item (and the electroadhesive surface) to conform to the target object (1028). The voltage applied to the electrodes can then be reduced to thereby release the item from the electroadhesive surface (1030). As a result, the item can remain on the target object. In some examples, the target object may be moved or otherwise manipulated prior to being released from the electroadhesive surface in block 1030. In some examples, the target object may be secured in a substantially stationary, fixed position prior to being released from the electroadhesive surface in block 1030. Thus, the electroadhesion can be used to move and/or secure the target object.

Figure 10C:
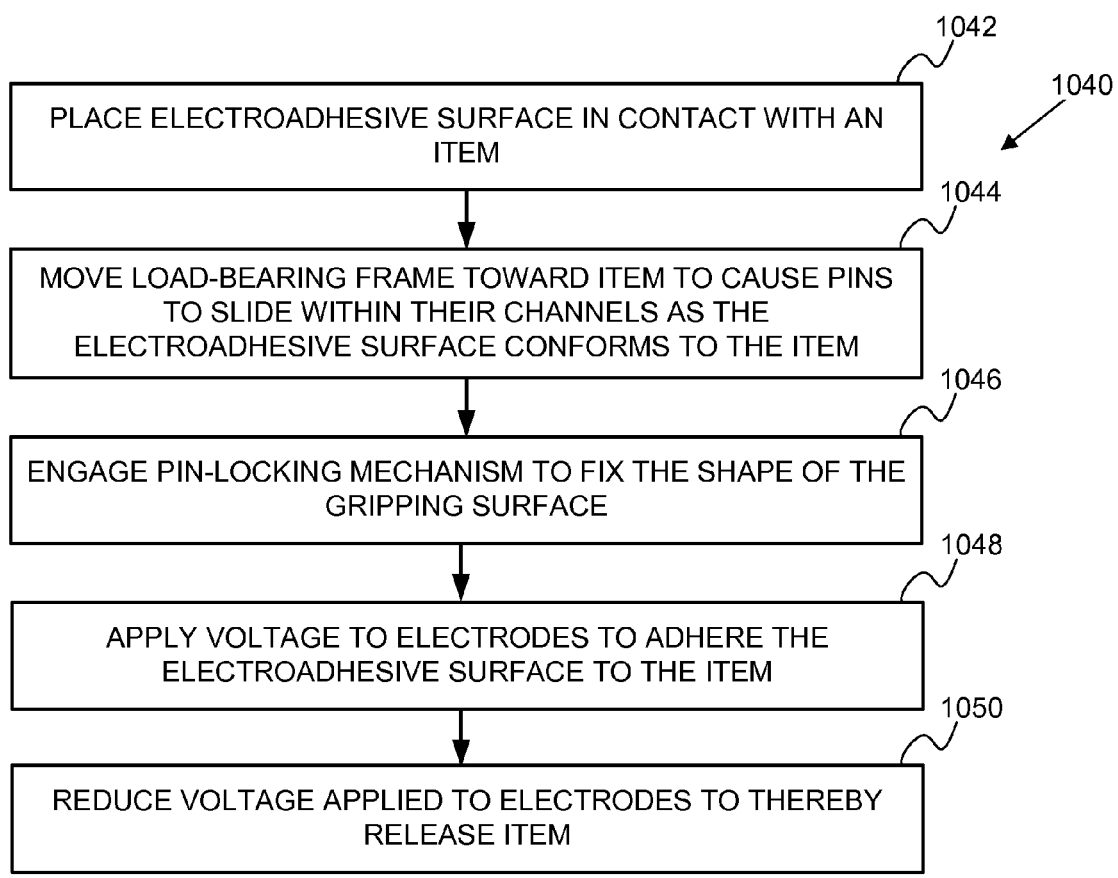
FIG. 10C is flowchart of an example process for operating an active pin-driven conformable gripper.

FIG. 10C is flowchart of an example process for operating an active pin-driven conformable gripper. The process 1040 may be performed, for example, by the active conformable gripping system described in connection with FIG. 6. An item is placed in contact with an electroadhesive surface of a gripping device (1042). The electroadhesive surface can be coupled to a load-bearing frame via an array of height-adjustable pins, which move within channels formed in the load-bearing frame to adjust the shape of the electroadhesive gripping surface. The load-bearing frame can then be moved toward the item, which causes certain ones of the pins to slide (e.g., retract) within their respective channels and thereby cause the electroadhesive surface to conform to the item (1044). In block 1044, the force of the item pushing against the electroadhesive surface as the load-bearing frame is moved toward the item can cause the pins to slide. A pin-locking mechanism can be engaged to fix the shape of the gripping surface (1046). In some cases, the pin-locking mechanism may secure the pins within their channels so as to resist insertion or withdrawal from the channels, such as occurs with the electroadhesive pin-locking device described above in connection with FIGS. 8-9. In some cases, the pin-locking mechanism may secure the pins so as to resist withdrawal yet still allow for insertion, such as occurs with the ratcheting mechanism described above in connection with FIG. 7. A polarizing voltage can be applied to the electrodes in the electroadhesive gripping surface to adhere the electroadhesive surface to the item (1048). With the shape of the electroadhesive surface fixed in the item-specific conformed shape, due to the process of blocks 1044-1046, and the item adhered to the electroadhesive surface, due to the process of block 1048, the item can optionally be manipulated via the load-bearing frame while remaining securely held by the conformed gripper. Once the item is repositioned, re-oriented, or otherwise manipulated as desired (or not), the voltage applied to the gripper electrodes is reduced to allow the item to detach from the electroadhesive surface (1050). In some examples, the item may be moved or otherwise manipulated prior to being released from the electroadhesive surface in block 1050. In some examples, the item may be secured in a substantially stationary, fixed position prior to being released from the electroadhesive surface in block 1050. Thus, the electroadhesion can be used to move and/or secure an adhered item.

In some examples, the load-bearing frame can be coupled to the electroadhesive surface via an enclosure filled with a fluid having reversibly adjustable viscosity, or by a particle-filled enclosure coupled to a pressure regulator to selectively allow freedom of movement by the particles. In such examples, the conformance of the electroadhesive surface in block 1044 can be performed by deformation of the enclosure. Similarly, in such examples, block 1046 may be replaced by fixing the shape of the enclosure by increasing the viscosity of the fluid or by applying vacuum pressure, or another technique.

Figure 11:
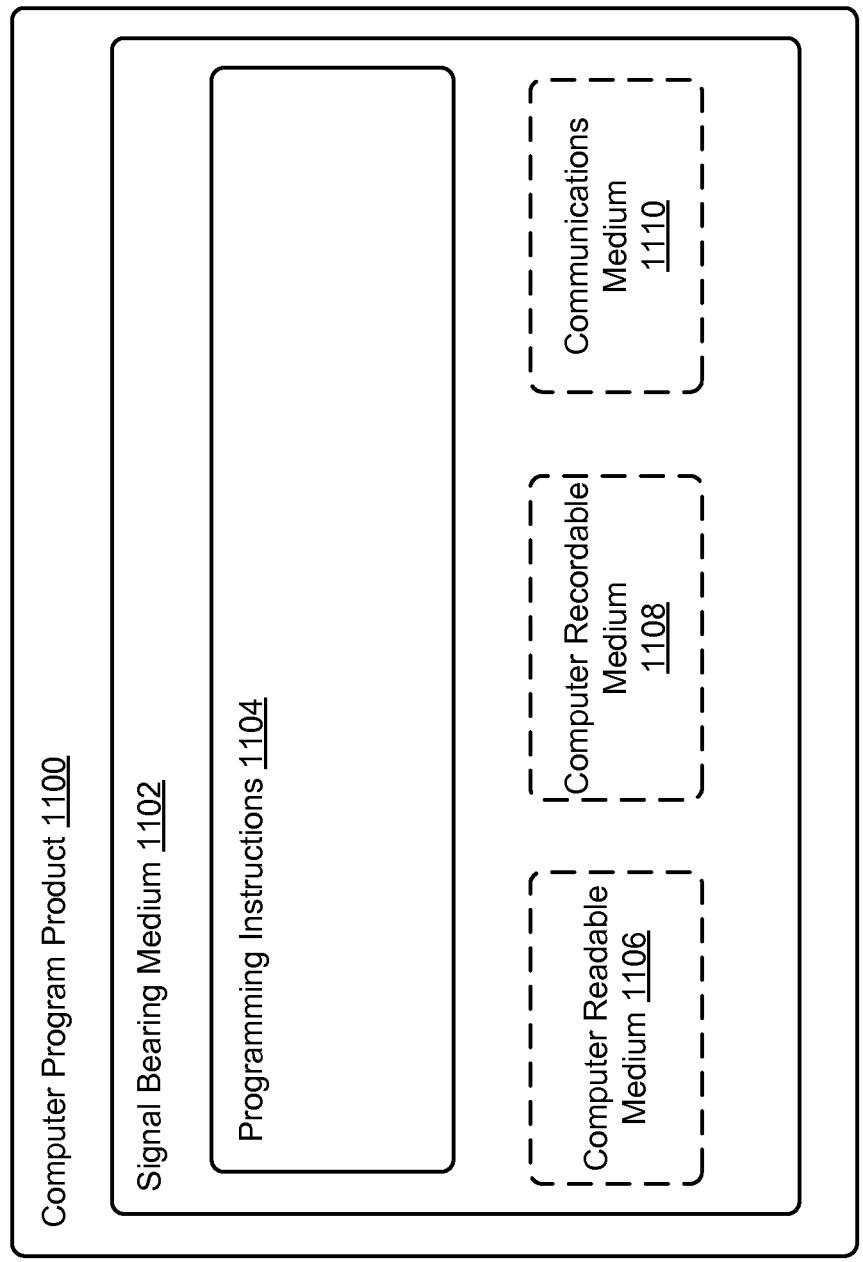
FIG. 11 depicts a computer-readable medium configured according to an example embodiment.

FIG. 11 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above.

As noted above, in some embodiments, the disclosed techniques can be implemented by computer program instructions encoded on a non-transitory computer-readable storage media in a machine-readable format, or on other non-transitory media or articles of manufacture. FIG. 11 is a schematic illustrating a conceptual partial view of an example computer program product that includes a computer program for executing a computer process on a computing device, arranged according to at least some embodiments presented herein, including the processes shown and described in connection with FIG. 10.

In one embodiment, the example computer program product 1100 is provided using a signal bearing medium 1102. The signal bearing medium 1102 may include one or more programming instructions 1104 that, when executed by one or more processors may provide functionality or portions of the functionality described above with respect to FIGS. 1-10. In some examples, the signal bearing medium 1102 can include a non-transitory computer-readable medium 1106, such as, but not limited to, a hard disk drive, a Compact Disc (CD), a Digital Video Disk (DVD), a digital tape, memory, etc. In some implementations, the signal bearing medium 1102 can be a computer recordable medium 1108, such as, but not limited to, memory, read/write (R/W) CDs, R/W DVDs, etc. In some implementations, the signal bearing medium 1102 can be a communications medium 1110, such as, but not limited to, a digital and/or an analog communication medium (e.g., a fiber optic cable, a waveguide, a wired communications link, a wireless communication link, etc.). Thus, for example, the signal bearing medium 1102 can be conveyed by a wireless form of the communications medium 1110.

The one or more programming instructions 1104 can be, for example, computer executable and/or logic implemented instructions. In some examples, a computing device is configured to provide various operations, functions, or actions in response to the programming instructions 1104 conveyed to the computing device by one or more of the computer readable medium 1106, the computer recordable medium 1108, and/or the communications medium 1110.

The non-transitory computer readable medium 1106 can also be distributed among multiple data storage elements, which could be remotely located from each other. The computing device that executes some or all of the stored instructions can be a microfabrication controller, or another computing platform. Alternatively, the computing device that executes some or all of the stored instructions could be remotely located computer system, such as a server.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A system comprising:
    an electroadhesive surface associated with one or more electrodes;
    a load-bearing frame including a plurality of pins passing through a plurality of corresponding channels, wherein the pins are coupled to the electroadhesive surface so as to couple the load-bearing frame to the electroadhesive surface, and wherein the pins are configured to slide within their corresponding channels to thereby adjust a shape of the electroadhesive surface; and
    a power supply configured to apply a voltage to the one or more electrodes associated with the electroadhesive surface to thereby cause the electroadhesive surface to adhere to an item situated proximate to the electroadhesive surface.

2. The system according to claim 1, wherein each given pin of the plurality of pins includes a first end coupled to the electroadhesive surface and a second end having a retaining cuff configured to mechanically interfere with a portion of the load-bearing frame such that the interference defines a maximum extension of the given pin from its corresponding channel.

3. The system according to claim 2, further comprising a biasing device configured to bias each given pin of the plurality of pins at its maximum extension.

4. The system according to claim 3, wherein the biasing device includes a compression spring.

5. The system according to claim 1, wherein the pins are configured to selectively:
    slide within their respective channels and thereby adjust the shape of the electroadhesive surface, and
    lock in position with respect to their corresponding channels and thereby fix the shape of the electroadhesive surface.

6. The system according to claim 5, wherein each given pin is selectively locked in place by an electroadhesive pin-retaining device situated along a sidewall of the channel within which the given pin slides, wherein the device includes one or more electrodes that, in response to application of a voltage to the one or more electrodes, cause the given pin to be adhered to the sidewall of the channel and thereby lock the given pin in place with respect to the channel.

7. The system according to claim 6, wherein the channels are arranged in rows and wherein the electroadhesive pin-retaining device is situated between adjacent rows of the channels so as to cause pins within the channels in the adjacent rows to adhere to sidewalls of their respective channels.

8. The system according to claim 6, wherein at least a portion of the sidewall of the channel is a substantially flat surface.

9. The system according to claim 6, further comprising:
    a controller configured to: (i) cause the power supply to apply voltage to the one or more electrodes of the electroadhesive surface so as to cause the electroadhesive surface to adhere to the item, and (ii) cause the power supply to apply voltage to the one or more electrodes of the electroadhesive pin-retaining device so as to adhere the pins to sidewalls of their respective channels and thereby fix the shape of the electroadhesive surface.

10. The system according to claim 1, further comprising a ratcheting collar that is configured to allow each given pin of the plurality of pins to be inserted into its corresponding channel while preventing the given pin from being withdrawn via mechanical interaction with the given pin.

11. The system according to claim 10, wherein the ratcheting collar includes an interfering face configured to engage teeth in a side surface of the given pin, wherein the interfering face is biased such that:
    upon the given pin being inserted into the channel, the movement of the pin causes the teeth to urge the interfering face to a non-interfering position so as to allow the given pin to slide within the channel, and
    upon the given pin being withdrawn from the channel, the teeth engage the interfering face to thereby retain the pin.

12. The system according to claim 10, wherein the ratcheting collar is further configured to be released and, upon release, to allow the given pin to be withdrawn from the channel.

13. The system according to claim 1, wherein the channels are formed in a rigid backing of the load-bearing frame such that the pins emerge from the rigid backing so as to position the electroadhesive surface with respect to the rigid backing, wherein the shape of the electroadhesive surface is related to a shape of the rigid backing by respective lengths of emerged portions of the pins.

14. The system according to claim 13, wherein the rigid backing has a substantially flat shape.

15. The system according to claim 1, wherein the channels are oriented in parallel.

16. A method comprising:
    placing an electroadhesive surface in contact with an exterior surface of an item, wherein the electroadhesive surface is coupled to a load-bearing frame via a plurality of pins configured to be received within a plurality of corresponding channels formed in the load-bearing frame, and wherein the pins are configured to slide within their corresponding channels to thereby adjust a shape of the electroadhesive surface;
    moving the load-bearing frame toward the exterior surface of the item such that one or more of the pins slide within their corresponding channels and thereby conform the electroadhesive surface to the exterior surface of the item;
    applying voltage to one or more electrodes associated with the electroadhesive surface to thereby cause the electroadhesive surface to adhere to the item; and
    reducing the voltage applied to the one or more electrodes such that the item is released from the electroadhesive surface.

17. The method according to claim 16, further comprising:
    applying voltage to an electroadhesive pin-retaining device having one or more electrodes situated along sidewalls of the channels within which the pins slide so as to cause the pins to be adhered to the sidewalls of their corresponding channels and thereby fix the shape of the electroadhesive surface.

18. The method according to claim 16, further comprising:
    fixing the shape of the electroadhesive surface by mechanically engaging teeth along sides of the pins to thereby prevent the pins from being withdrawn from their corresponding channels.

19. The method according to claim 18, further comprising:
    releasing the mechanical engagement to thereby allow the pins to be withdrawn from their corresponding channels.

20. The method according to claim 16, further comprising:
    locking the pins in position with respect to their corresponding channels to thereby fix the shape of the electroadhesive surface.

* * * * *